(12) United States Patent
Pfirsch et al.

(10) Patent No.: US 9,337,185 B2
(45) Date of Patent: May 10, 2016

(54) SEMICONDUCTOR DEVICES

(71) Applicant: Infineon Technologies AG, Neubiberg (DE)

(72) Inventors: Frank Pfirsch, Munich (DE); Dorothea Werber, Munich (DE); Carsten Schaeffer, Annenheim (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/561,357

(22) Filed: Dec. 5, 2014

(65) Prior Publication Data

US 2015/0179637 A1    Jun. 25, 2015

Related U.S. Application Data

(63) Continuation-in-part of application No. 14/133,912, filed on Dec. 19, 2013.

(51) Int. Cl.
*H01L 21/70* (2006.01)
*H01L 21/8248* (2006.01)
*H01L 27/06* (2006.01)
(Continued)

(52) U.S. Cl.
CPC ........ *H01L 27/0635* (2013.01); *H01L 27/0727* (2013.01); *H01L 29/0615* (2013.01); *H01L 29/0804* (2013.01); *H01L 29/1095* (2013.01); *H01L 29/4236* (2013.01);
(Continued)

(58) Field of Classification Search
CPC ............ H01L 29/1095; H01L 29/7397; H01L 29/66348; H01L 29/7395

USPC ............................................. 257/140
See application file for complete search history.

(56) References Cited

U.S. PATENT DOCUMENTS 3,927,225 A * 12/1975 Cordes et al. ............... 438/581
5,874,338 A * 2/1999 Ferla et al. .................. 438/268
(Continued)

FOREIGN PATENT DOCUMENTS

DE    102005018366 A1    11/2005
DE    10085054 B4    12/2005

OTHER PUBLICATIONS

Infineon Technologies AG, "Fast Switching EmCon Diode", Infineon Technologies AG, Sep. 1, 2007, pp. 1-7.
(Continued)

*Primary Examiner* — Andy Huynh
*Assistant Examiner* — Sitaramarao S Yechuri
(74) *Attorney, Agent, or Firm* — Murphy, Bilak & Homiller, PLLC

(57) ABSTRACT

A semiconductor device includes a first doping region extending from a main surface of a semiconductor substrate into the semiconductor substrate. Further, the semiconductor device includes a second doping region arranged adjacent to the first doping region. The first doping region includes at least one low doping dose portion extending from the main surface of the semiconductor substrate to the second doping region. A doping dose within the low doping dose portion of the first doping region is less than 3 times a breakdown charge. Additionally, the semiconductor device includes a first electrode structure in contact with the first doping region at the main surface of the semiconductor substrate. The work function of the first electrode structure at the main surface of the semiconductor substrate is larger than 4.9 eV or lower than 4.4 eV.

16 Claims, 15 Drawing Sheets

(51) Int. Cl.
*H01L 29/06* (2006.01)
*H01L 29/08* (2006.01)
*H01L 29/10* (2006.01)
*H01L 29/423* (2006.01)
*H01L 29/47* (2006.01)
*H01L 29/739* (2006.01)
*H01L 29/66* (2006.01)
*H01L 27/07* (2006.01)

(52) U.S. Cl.
CPC ......... *H01L 29/47* (2013.01); *H01L 29/66348* (2013.01); *H01L 29/7397* (2013.01)

(56) References Cited

U.S. PATENT DOCUMENTS

| | | | |
|---|---|---|---|
| 6,049,108 A * | 4/2000 | Williams et al. | 257/341 |
| 7,183,610 B2 * | 2/2007 | Pattanayak et al. | 257/333 |
| 7,557,386 B2 | 7/2009 | Ruething et al. | |
| 8,384,151 B2 | 2/2013 | Pfirsch | |
| 2002/0060340 A1 * | 5/2002 | Deboy et al. | 257/330 |
| 2004/0021203 A1 * | 2/2004 | Flohrs et al. | 257/578 |
| 2008/0230844 A1 * | 9/2008 | Yu et al. | 257/377 |
| 2010/0032711 A1 * | 2/2010 | Aono et al. | 257/139 |
| 2010/0301410 A1 * | 12/2010 | Hirler | 257/334 |
| 2012/0181575 A1 * | 7/2012 | Pfirsch | 257/139 |
| 2013/0069710 A1 | 3/2013 | Hirler et al. | |

OTHER PUBLICATIONS

Matsudai, et al., "Advanced Cathode and Anode Injection Control Concept for 1200V SC(Schottky Controlled Injection)-Diode", "Proceedings of the 26th International Symposium on Power Semiconductor Devices & IC's", Jun. 19, 2014, pp. 19-22.

Padmanabhan, et al., "A Novel Trench Fast Recovery Diode with Injection Control", "Proceedings of the 26th International Symposium on Power Semiconductor Devices & IC's", Jun. 19, 2014, pp. 23-26.

Rahimo, M et al., "The Bi-mode Insulated Gate Transistor (BIGT) A Potential Technology for Higher Power Applications", Rahimo, M., et al., "The Bi-mode Insulated Gate Transistor (BIGT) A Potential Technology for Higher Power Applications." International Symposium on Power Semiconductor Devices & ICs, Jun. 2009, pp. 283-286, Barcelona.

Werber, et al., "Semiconductor Device, Method for Manufacturing the Same and IGBT with Emitter Electrode Electrically Connected with Impurity Zone", U.S. Appl. No. 14/178,419, filed Feb. 12, 2014.

* cited by examiner

SEMICONDUCTOR DEVICES

TECHNICAL FIELD

Embodiments relate to measures for decreasing switching losses of semiconductor devices and in particular to semiconductor device and a method for forming a semiconductor device.

BACKGROUND

Many functions of modern devices in automotive, consumer and industrial applications, such as converting electrical energy and driving an electric motor or an electric machine, rely on semiconductor devices. Insulated Gate Bipolar Transistors (IGBTs) have been used for various applications including but not limited to switches in power supplies and power converters. Further, flyback diodes or freewheeling diodes are often used to eliminate flyback, which is the sudden voltage spike seen across an inductive load when its supply voltage is suddenly reduced or removed.

The direction of current flow through IGBTs operating as switches or motor drivers may be different in different operating cycles. In a forward mode of the IGBT, the pn-body diode at the body-drain junction of the IGBT is reversely biased and the resistance of the device can be controlled by the voltage applied to the gate electrode of the IGBT. Further, in a reverse mode, the pn-body diode is forwardly biased. In general, it is desired to keep switching losses of semiconductor devices low.

SUMMARY

An embodiment relates to a semiconductor device comprising a first doping region extending from a main surface of a semiconductor substrate into the semiconductor substrate. The first doping region comprises a first conductivity type. Further, the semiconductor device comprises a second doping region arranged adjacent to the first doping region. The second doping region comprises a second conductivity type. The first doping region comprises at least one low doping dose portion extending from the main surface of the semiconductor substrate to the second doping region. A doping dose within the low doping dose portion of the first doping region is less than 3 times a breakdown charge. Additionally, the semiconductor device comprises a first electrode structure in contact with the first doping region at the main surface of the semiconductor substrate. The work function of the first electrode structure at the main surface of the semiconductor substrate is larger than 4.9 eV or lower than 4.4 eV. Further, the semiconductor device comprises a second electrode structure in contact with the second doping region.

An embodiment relates to a semiconductor device comprising at least one field effect transistor structure, which is formed on a semiconductor substrate. The field effect transistor structure comprises a drift region, a body region, a source region and a gate. The source region and the drift region comprise at least mainly a doping of a first conductivity type, whereas the body region comprises at least mainly a second conductivity type. The body region comprises at least one low doping dose portion extending from the drift region to at least one of the source region or an electrical contact interface of the body region at a main surface of the semiconductor substrate, wherein a doping dose within the low doping dose portion is less than 3 times the breakdown charge is applied.

In some embodiments a semiconductor device comprises at least one field effect transistor structure formed on a semiconductor substrate comprising a drift region, at least one body region, at least one source region and at least one gate. The source region and the drift region comprise at least mainly a first conductivity type and the body region comprises at least mainly a second conductivity type. Further, the semiconductor device comprises at least an inter cell area of the second conductivity type and at least a diode region of the second conductivity type forming a pn-junction with the drift region separated from the body region. The semiconductor device comprises a gate trench reaching vertically from the main surface to the drift region and separating the at least one field effect transistor structure from the at least one inter cell area. Further, at least one gate of the at least one field effect transistor structure is arranged within the gate trench. The gate area is insulated from the body region, the source region and the drift region of the at least one field effect transistor structure. Further, the semiconductor device comprises a diode trench containing a filled area filled by electrically conductive material being floating, electrically connectable to a gate potential or a predefined potential or connected to a gate potential or a predefined potential. The diode trench reaches vertically from the main surface to the drift region and separates the inter cell area from the diode region. The filled area is insulated from the body region, the source region and the drift region of the field effect transistor structure by an insulation layer. Further, a thickness of the insulation layer of the gate area within the gate trench may differ from a thickness of an insulation layer of the filled area within the diode trench.

In some embodiments a semiconductor device comprises at least one field effect transistor structure formed on a semiconductor substrate. The at least one field effect transistor structure includes a drift region, at least one body region, at least one source region and at least one gate, wherein the source region and the drift region comprise at least mainly a first conductivity type. The body region comprises at least mainly a second conductivity type. The semiconductor further comprises a diode region of the second conductivity type forming a pn-junction with the drift region apart from the body region. The diode region comprises at least one low doping dose portion extending from an electrical contact interface of the body region at a main surface of the semiconductor substrate to the drift region. Further, a doping dose within the low doping dose portion is less than 3 times a breakdown charge.

BRIEF DESCRIPTION OF THE FIGURES

Some embodiments of apparatuses and/or methods will be described in the following by way of example only, and with reference to the accompanying figures, in which.

DETAILED DESCRIPTION

Figure 1A:
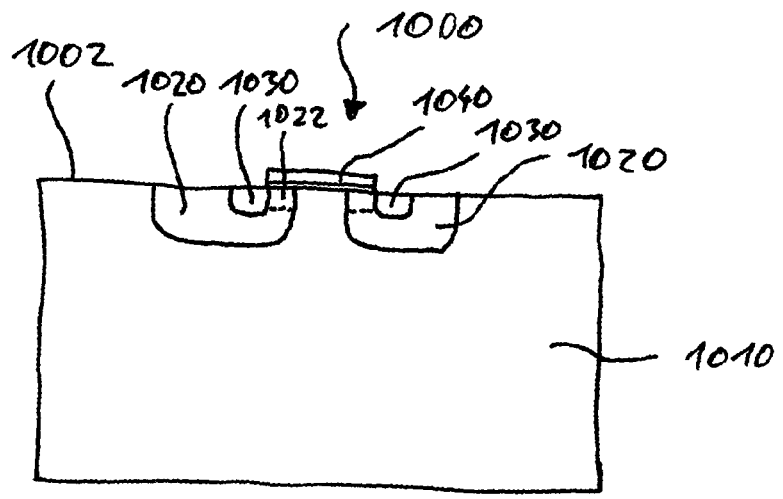
FIG. 1A, 1B show schematic cross sections of semiconductor devices.

Various example embodiments will now be described more fully with reference to the accompanying drawings in which some example embodiments are illustrated. In the figures, the thicknesses of lines, layers, areas and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Directional terminology, such as "top," "bottom," "front," "back,", "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

Reference will now be made in detail to various embodiments, one or more examples of which are illustrated in the figures. Each example is provided by way of explanation, and is not meant as a limitation of the disclosure. For example, features illustrated or described as part of one embodiment can be used on or in conjunction with other embodiments to yield yet a further embodiment. It is intended that the present disclosure includes such modifications and variations. The examples are described using specific language which should not be construed as limiting the scope of the appended claims.

The drawings are not to scale and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated.

For example, two different n+-doping regions can have different absolute doping concentrations. The same applies, for example, to an n+-doping and a p+-doping region.

Specific embodiments described in this specification pertain to, without being limited thereto, monolithically integrated semiconductor devices having a reverse conducting IGBT structure, in particular to power semiconductor devices such as reverse conducting power IGBTs, or a MOSFET structure (metal oxide semiconductor field effect transistor).

In the context of the present specification, the terms "in ohmic contact", "in electric contact", "in contact", "in ohmic connection", and "electrically connected" intend to describe that there is an ohmic electric connection or ohmic current path between two areas, regions, portion or parts of a semiconductor devices or between different terminals of one or more devices or between a terminal or a metallization or an electrode and a portion or part of a semiconductor device.

The reverse conducting operation mode (diode mode) of RC-IGBTs may be optimized by lowering the accumulation charge, which is mainly responsible for switching losses, when the diode is commuting.

Figure 1B:
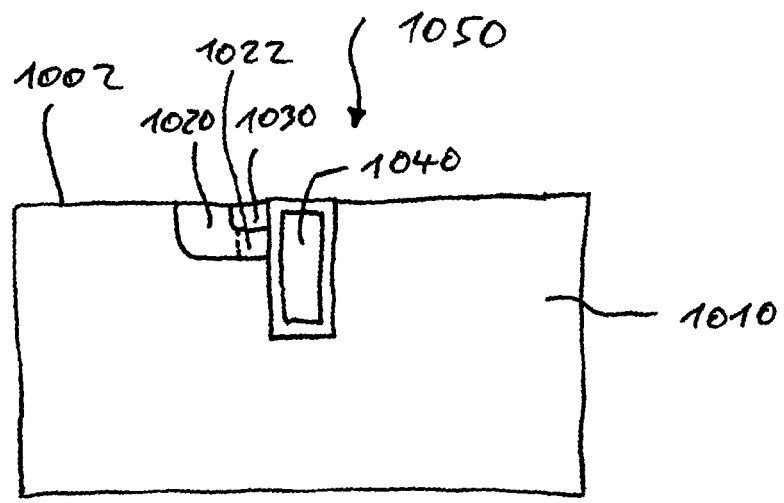

FIGS. 1A and 1B show schematic cross sections of parts of semiconductor devices 1000, 1050 according to embodiment. A semiconductor device 1000, 1050 comprises at least one field effect transistor structure formed on a semiconductor substrate comprising a drift region 1010, at least one body region 1020, at least one source region 1030 and at least one gate 1040. The source region 1030 and the drift region 1010 comprise at least mainly a first conductivity type (n-doping or p-doping) and the body region 1020 comprises at least mainly a second conductivity type (p-doping or n-doping). Further, the body region 1020 comprises at least a low doping dose portion 1022 extending from the drift region to at least one of the source region 1030 or an electrical contact interface of the body region 1020 at a main surface of the semiconductor substrate. In other words, the body region 1020 comprises at least one low doping dose portion 1022 extending from the source region 1030 or an electrical contact interface of the body region at a main surface 1002 of the semiconductor substrate to the drift region 1010. A doping dose within the low doping dose portion 1022 is less than 3 times a breakdown charge.

By implementing a low doping dose within at least a part of the body region 1020 extending from the source region 1030 or a electrical contact interface of the body region at the main surface 1002 to the drift region 1010, the emitter efficiency (when operating in diode mode) of the body region 1020 towards the drift region 1010 may be lowered. Further, a reverse recovery charge may be kept low and switching losses may be reduced.

The semiconductor substrate of the semiconductor device may be a silicon-based semiconductor substrate, a silicon carbide-based semiconductor substrate, a gallium arsenide-based semiconductor substrate or a gallium nitride-based semiconductor substrate, for example.

A doping region of the first conductivity type may comprise a p-doping (e.g. caused by incorporating aluminum ions or boron ions) or an n-doping (e.g. caused by incorporating nitrogen ions, phosphor ions or arsenic ions). Consequently, the second conductivity type indicates an opposite n-doping or p-doping. In other words, the first conductivity type may indicate an n-doping and the second conductivity type may indicate a p-doping or vice-versa.

The doping region may comprise mainly a specific conductivity type, if the part of the semiconductor structure occupied by the doping region comprises a doping of the specific conductivity type over more than 50% (or more than 70% or more than 90%) of the volume, while enclosed sub areas are of the other conductivity type, for example.

The body region comprises at least one low doping dose portion 1022 (e.g. extending over a part of the body region or throughout the whole body region) extending from the source region 1030 (e.g. a pn-junction between the body region and the source region) or an electrical contact interface of the body region at a main surface of the semiconductor substrate to the drift region 1010 (e.g. a pn-junction between the body region and the drift region).

A main surface of the semiconductor device may be a semiconductor surface of the device towards metal layers, insulation layers or passivation layers on top of the semiconductor surface. In comparison to a basically vertical edge (e.g. resulting from separating the semiconductor dies from others) of the semiconductor structure, the main surface of the semiconductor structure may be a basically horizontal surface extending laterally. The main surface of the semiconductor structure may be a basically even plane (e.g. neglecting unevenness of the semiconductor structure due to the manufacturing process). In other words, the main surface of the semiconductor device may be the interface between the semiconductor material and an insulation layer, metal layer or passivation layer on top of the semiconductor substrate.

The doping dose within the low doping dose portion 1022 is less than 3 times a breakdown charge. The doping dose within the low doping dose portion 1022 may be equal to an integral or a sum over a net doping concentration (acceptors minus donators or vice versa) along a path characteristic for the low doping dose portion 1022 extending from the source region 1030 or an electrical contact interface of the body region at a main surface of the semiconductor substrate to the drift region 1010. The characteristic path may be a path between the source region 1030 or an electrical contact interface of the body region at a main surface of the semiconductor substrate and the drift region 1010 comprising the lowest doping dose.

For example, the characteristic path may be equal to a shortest distance between the source region 1030 or an electrical contact interface of the body region at a main surface of the semiconductor substrate and the drift region 1010, if the whole body region comprises a homogeneous doping concentration. There may be more than one path extending from the source region 1030 or an electrical contact interface of the body region at a main surface of the semiconductor substrate to the drift region 1010 comprising a doping dose lower than 3 times a breakdown charge. The volume of the body region 1020 comprising paths with a doping dose lower than 3 times a breakdown charge may be the low doping dose portion 1022.

The low doping dose portion 1022 or a characteristic path of the low doping dose portion 1022 may reach vertically from the source region 1030 or the electrical contact interface of the body region at the main surface to the drift region 1010 (e.g. for a trench field effect transistor structure). However, also other directions may be possible for a characteristic path of the low doping dose portion 1022 (e.g. for a planar field effect transistor structure with a lateral shorter distance between drift region and source region than vertically).

The breakdown charge may be a breakdown charge of the semiconductor material of the semiconductor substrate. In other words, the size of the breakdown charge may depend on the used semiconductor material. For example, the breakdown charge of silicon may be $1.3E12/cm^2$. Consequently, a doping dose within the low doping portion may be less than $3.9E12$ doping atoms/$cm^2$.

The reduction of the effective p-dose in the IGBT or diode cells may be limited due to the electric field, which may be built up at the pn-junction in blocking mode and must not reach the source region or the emitter contact. A certain doping dose is needed to absorb the electric field within the body region. An estimation of the necessary dose is the value of $\varepsilon\varepsilon_0 E_{max}/q$, where $E_{max}$ is the maximum expected electric field during operation, $\varepsilon\varepsilon_0$ is the permeability and q is the elementary charge. Using the breakdown field strength in silicon of about $2*10^5$ V/cm for $E_{max}$, the result for this so-called breakdown charge (representing a dopant dose) in silicon is approximately $1.3*10^{12}/cm^2$. To be specific, this value shall be used as breakdown charge if the semiconductor material is silicon. For other semiconductor materials the value $\varepsilon\varepsilon_0 E_{BD}/q$ shall be used, where $E_{BD}$ is the breakdown field strength for the respective semiconductor material.

The doping dose along a vertical path through the body region 1020 may be equal or less than a number of dopants per area implanted during the implantation of the body region 1020.

For example, in other words, a semiconductor device 1000, 1050 may contain at least one field effect transistor structure comprising a drift region of a first conductivity type, at least one source region of the first conductivity type, a body region of a second conductivity type separating the drift region and the at least one source region, forming a first pn-junction with the drift region and forming a second pn-junction with the at least one source region, at least one gate electrode, and an emitter electrode in electrical contact with the at least one source region and forming a first electrical contact interface to the body region, the second pn-junction and the first electrical contact interface forming a first boundary. The minimum of a doping dose within the body region between the first boundary and the first pn-junction is less than 3 times a breakdown charge of the first pn-junction.

The body region 1020 may comprise a laterally homogeneous doping concentration. A semiconductor region may comprise a laterally homogeneous doping concentration, if a doping concentration comprises less than 10% (or less than 20% or less than 5%) deviation in the lateral/horizontal direction.

Depending on the implant energies and/or annealing conditions used for forming the body region 1020, the body region 1020 may also comprise a vertically homogeneous doping concentration (e.g. doping concentration comprises less than 10% deviation in the vertical direction). Alternatively, the doping concentration within the body region 1020 may vary vertically.

FIG. 1B shows an example for a semiconductor device 1000 with a trench field effect transistor structure comprising a gate arranged within a trench and FIG. 1A shows an example for a semiconductor device 1000 with a planar field effect transistor structure comprising a gate arranged along the main surface of the semiconductor substrate.

The following embodiments relate to IGBT structures, although the described concept may also be implemented by other field effect transistor structures (e.g. MOSFET).

Figure 1C:
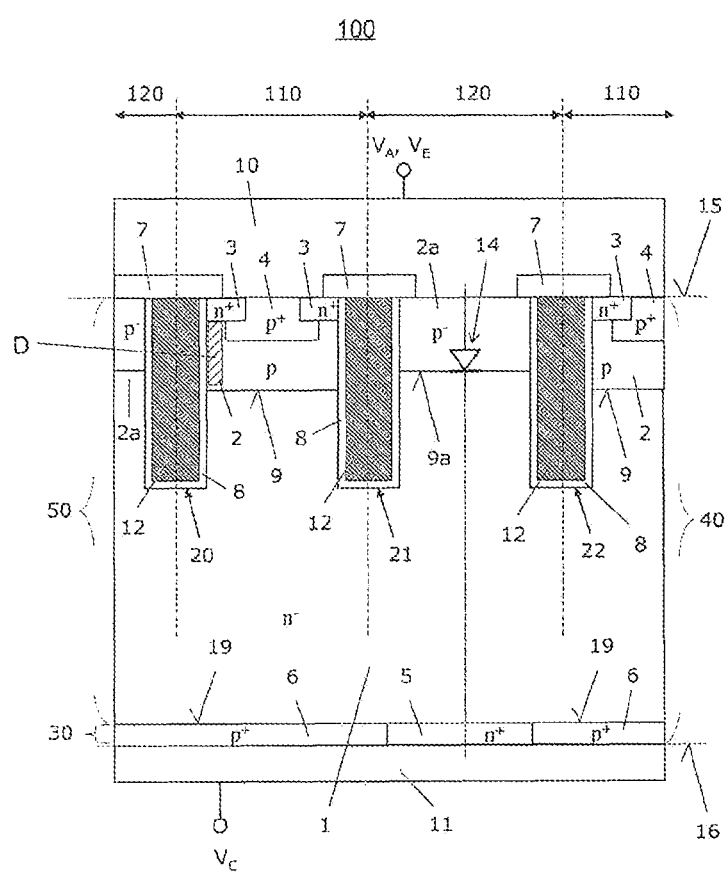
FIG. 1C schematically illustrates a vertical cross-section of a vertical semiconductor device according to one or more embodiments, in particular a trench RC-IGBT containing separate transistor and diode cells.

The structure of a trench IGBT is described in detail by FIG. 1C schematically illustrating an embodiment of a semiconductor device 100 in a section of a vertical cross-section. The semiconductor device 100 includes a semiconductor substrate 40 having a first or main horizontal surface 15 and a second surface or back surface 16 arranged opposite the first surface 15. The normal direction of the first or main surface 15 is substantially parallel to the vertical direction. The semiconductor substrate 40 can be a single bulk mono crystalline material. The semiconductor substrate 40 can also include a bulk monocrystalline material 30 and at least one epitaxial layer 50 formed thereon. Using epitaxial layers 50 provides more freedom in tailoring the background doping of the material since the doping concentration can be adjusted during deposition of the epitaxial layer or layers.

In the following, embodiments pertaining to semiconductor devices are explained mainly with reference to silicon (Si) semiconductor devices. Accordingly, a monocrystalline semiconductor region, area or layer is for example a monocrystalline Si-region or Si-layer. It should, however, be understood that the semiconductor substrate 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($SixC1\_x$) and silicon-SiGe heterojunction semiconductor materials. For power semiconductor applications currently mainly Si, SiC, GaAs and GaN materials are used. If the semiconductor substrate comprises a band gap material such as SiC or GaN which has a high breakdown voltage and critical avalanche field strength, respectively, the doping of the respective semiconductor regions can be chosen higher which may improve the switching ruggedness of the device.

Some semiconductor devices, like IGBTs (Insulated Gate Bipolar Transistors) comprise a semiconductor substrate 40 including an n-type base area/region or drift region 1 which is arranged between the back surface 16 and the main surface 15. They have in common with e.g. MOSFETs (Metal Oxide Field Effect Transistors) a first electrode 10 arranged on the main surface 15 and a second electrode 11 arranged on the back surface 16. A first vertical trench 20, a second vertical trench 21 and a third vertical trench 22 extend from the main surface 15 partially into the drift region 1. Each vertical trench 20, 21, 22 includes a respective gate electrode 12 which is insulated by a respective gate dielectric region 8 from the semiconductor substrate 40 and by an insulating plug 7 from the first electrode 11.

A p-type body region 2 extends between the first vertical trench 20 and the second vertical trench 21, i.e. between the gate dielectric regions 8 of the vertical trenches 20, 21. The body region 2 forms a first pn-junction 9 with the drift region 1. Two n+-type source regions 3 in (e.g. ohmic) contact with the first electrode 10 are arranged between the first vertical trench 20 and the second vertical trench 21. Each of the two source regions 3 adjoins one of the first vertical trench 20 and the second vertical trench 21.

A p+-type anti-latch-up region 4 in ohmic contact with the first electrode 10 may be arranged between the first vertical trench 20 and the second vertical trench 21. The anti-latch-up region 4 may provide a low ohmic contact between the first electrode 10 and the body region 2. In the exemplary embodiment illustrated in FIG. 1C, the anti-latch-up region 4 adjoins the two source regions 3.

A further pn-junction 19 is arranged vertically below the first pn-junction 9 and formed between the drift region 1 and a p or p+-type backside p– emitter region 6 in ohmic contact with the second electrode 11. Accordingly, the source region 3 form with the body region 2, the drift region 1 and the backside p– emitter region 6 a parasitic thyristor structure between the first and second electrodes 10, 11 and between the insulated gate electrodes 12 in the first vertical trench 20 and the second vertical trench 21, respectively. The insulated gate electrodes 12 extend vertically from the main surface 15 below the first pn-junction 9. Accordingly, an n-type channel region may be formed in the body region 2 along the respective insulating region 8 between the source region 3 and the drift region 1 by appropriately biasing the gate electrode 12 relative to the first electrode 10. In other words, the semiconductor device 100 includes an IGBT-cell 110 with an anti-latch-up region 4 and may thus be operated as an IGBT.

Accordingly, the first electrode 10 may form an emitter electrode 10 and the second electrode 11 may form a collector electrode 11.

In forward conduction mode of the semiconductor device 100, the gate voltage VG applied to the gate electrodes 12 exceeds the emitter voltage VE applied to the first electrode 10 such that channel regions are formed in the body region 2 of each IGBT-cell 110 and the collector voltage VC applied to the second electrode 11 is higher than the emitter voltage VE, for example.

During forward conduction mode, holes are injected into the drift region 1 from the backside p– emitter regions 6, also called collector regions 6. A part of the injected holes recombine in the drift region 1 with electrons from the channel regions. Another part of the injected holes, flow across the first pn-junctions 9 and thus a voltage drop in the body regions 2 is formed.

This voltage drop tends, in an IGBT-cell structure having no anti-latch-up region, to forwardly bias the pn-junctions formed between the source regions and the body region. At large enough voltage drop, electrons are injected from the source regions into the body region. Accordingly, a parasitic npn-transistor formed by the source region, the body region and the drift region as well as a pnp-transistor formed by the body region, the drift region and the collector region may be turned on. In such an event, the thyristor formed by the parasitic npn-transistor and the pnp-transistor latches up. The IGBT-cell structure is now in a latch-up state. During latch-up, the gate electrodes have no control on the current between the source region and the collector region. Therefore the device cannot be turned off and may be destroyed.

Latch-up of the two IGBT-cells 110 illustrated in FIG. 1C may be avoided by the respective anti-latch-up regions 4 having a maximum doping concentration which is higher than a maximum doping concentration of the adjoining body region 2, and extending vertically deeper, e.g. by a factor of 1.5 or more, into the adjoining body region 2 than the source regions 3. In doing so, non-latch-up operation of IGBT-cells 110 may be provided over the entire operation range of semiconductor device 100. For example, the maximum doping concentration of the anti-latch-up regions 4 is at least ten times higher than the maximum doping concentration of the adjoining body region 2.

Furthermore, the second electrode 11 may be in ohmic contact with the drift region 1 via an n-type contact area or backside n-emitter region 5 which is arranged between the second electrode 11 and drift region 1 and may have a maximum doping concentration which is higher than a maximum doping concentration of the drift region 1. Accordingly, a current may also flow in a reverse mode, in which the collector voltage VC is lower than the emitter voltage VE, between the first and second electrodes 10, 11 and across the forwardly biased first pn-junction 9. In other words, semiconductor device 100 has a first integrated free-wheeling diode, with its current path running across the body diode formed between the body region 2 and the drift region 1, and may thus be operated as a reverse conducting semiconductor device 100.

According to an embodiment, a p-type diode region with an diode region 2a (e.g. anode region) extends between the second vertical trench 21 and the third vertical trench 22 and forms a second pn-junction 9a with the drift region 1 only. In other words, no source regions 3 are, in the shown vertical cross-section, formed in the diode region 2a, i.e. between the second vertical trench 21 and the third vertical trench 22. For example, no anti-latch-up region is, in the shown vertical cross-section, formed between the second vertical trench 21 and the third vertical trench 22.

Semiconductor device 100 may include an IGBT-cell 110 and a diode-cell 120 with a diode region 2a forming a second pn-junction 9a with the drift region 1. Accordingly, semiconductor device 100 further includes an additional integrated free-wheeling diode 14 which is connected in parallel to the first integrated free-wheeling diode, i.e. between the second electrode 11 and the first electrode 10 which forms an anode for the integrated free-wheeling diodes. Compared to reverse conducting IGBTs having only a first integrated freewheeling diode, semiconductor device 100 offers more freedom in optimizing the device performance with respect to latch-up robustness and switching performance.

The n-emitter region 5 and the diode region 2a may overlap in a projection on a horizontal plane. Accordingly, a short current path through the additional integrated free-wheeling diode 14 may be provided in reverse mode of the semiconductor device 100. The p-emitter regions 6 and the n-emitter regions 5 however may be adjusted to the structures at the main surface 15. They also may be different in size and shape from the cells at the main surface 15.

The maximum doping concentration of the anti-latch-up region 4 is for example at least 10 times higher than the maximum doping concentration of the diode region 2a. Because the diode-cell 120 does not have an anti-latch-up region, the hole emitting efficiency between the body region 2 and the drift region 1 may be higher than the hole emitting efficiency between the diode region 2a and the drift region 1. Due to the lower hole emitting efficiency of the additional integrated free-wheeling diode 14, the flooding of drift region 1 with holes may be substantially reduced in reverse mode. On the other hand, the latch-up stability of the IGBT-cell 110 in forward mode may be maintained. Accordingly, the reverse current peak and the reverse recovery energy of semiconductor device 100 and the switching-on energy of the IGBT-cell 110 may be reduced compared to reverse conducting IGBTs using only the body diode as an integrated free-wheeling diode. Accordingly, the semiconductor device 100 is for example better suited for switching applications, in particular hard-switching applications.

Semiconductor device 100 may also be described as a reverse conducting trench IGBT 100 with separated IGBT-cells 110 and diode cells 120, whereas the hole emitting efficiency of the diode cells 120 may be lower, for example three to ten times lower, than the hole emitting efficiency of the body diode of the IGBT-cells 110.

According to an embodiment, the semiconductor device 100 is a vertical power semiconductor device with an active area having a plurality of IBGT-cells 110 and/or diode-cells 120 for carrying and/or controlling a load current, and a peripheral area with an edge-termination structure. In these embodiments, the IGBT-cell 110 arranged between the first vertical trench 20 and the second vertical trench 21 and the diode-cell 120 arranged between the second vertical trench 21 and the third vertical trench 22 may correspond to a unit cell of the active area. The unit cells may be arranged on a horizontal one- or two-dimensional lattice, for example on a hexagonal or quadratic lattice. The IGBT-cells 110 and the diode-cells 120 may also be arranged on different horizontal lattices. Alternatively, only the IGBT-cells 110 or only the diode-cells 120 are arranged on a horizontal lattice.

Furthermore, the contact region 5 and/or the collector regions 6 may horizontally extend over several IGBT-cells 110 and/or diodes-cells 120 in a power semiconductor device 100. At low current densities in forward mode, a unipolar electron current through drift region 1 and the n-emitter region 5 may result in a non-monotonic current-voltage characteristic. This is for example avoided or at least reduced when the collector regions 6 extend over several IGBT-cells 110 and/or diodes-cells 120.

The semiconductor device 100 may, however, include only one or a few IGBT-cells 110 and only one or a few diode-cells 120, for example as part of an integrated circuit and/or in high-frequency low power applications.

FIG. 1C represents a cross-sectional view. Other cross-sectional views of the semiconductor device 100 may be similar, for example when the illustrated semiconductor areas and regions, insulating areas, electrodes and vertical trenches are, in a direction which is perpendicular to the illustrated cross-section, substantially bar-shaped. It is, however, also possible that the body regions 2 and the anti-latch-up regions 4 are square or disc-shaped and that the first and second vertical trenches 20, 21 correspond to a single connected, e.g. ring-shaped vertical trench. In these embodiments, the two illustrated separated source regions 3 of the left IGBT-cell 11 for example also correspond to a single connected, e.g. ring-shaped, source region.

Furthermore, the order of IGBT-cells 110 and diode-cells 120 may alternate, for example, in a direction which is perpendicular to the illustrated cross-section in FIG. 1C. This means that in a further vertical cross-section, which is parallel to the cross-section of FIG. 1C, a further p-type anti-latch-up region as well as further two source regions may be arranged between the second vertical trench 21 and the third vertical trench 22. In these embodiments, there are for example no anti-latch-up regions and no source regions arranged between the first vertical trench 20 and the second vertical trench 21, in the further vertical cross-section.

As an embodiment, the diode region 2a as displayed in FIG. 1C extends vertically less deep into the semiconductor substrate 40. Furthermore, the maximum doping concentration of the diode region 2a is lower than the maximum doping concentration of the body region 2.

Accordingly, the hole emitting efficiency between the diode region 2a and the drift region 1 is further reduced compared to the hole emitting efficiency between the body region 2 and the drift region 1. Thus, the reverse current peak and the reverse recovery energy of the semiconductor device 100 and the switching-on energy of the IGBT-cells 110 may be reduced.

According to an embodiment, the maximum doping concentration of the body region 2 may be at least two times higher, for example five times higher, or even more than ten times higher than the maximum doping concentration of the diode region 2a.

The contact between a metal layer and a doped region can be ohmic or a Schottky contact. To get the contact ohmic, a highly doped region facing the metal contact may be implemented. According to the application, either type of contact may be formed.

Optionally, an n-type field-stop zone (not depicted in FIG. 1C) may be arranged between the drift region 1 and the backside n-emitter region 5 and between the drift region 1 and the backside p-emitter region or collector region 6. Accordingly, the semiconductor device 100 may be operated as a reverse conducting punch-through IGBT. Furthermore, a field-stop zone may also be provided for the other semiconductor devices disclosed herein.

The term "gate electrode" as used in this specification intends to describe an electrode which is insulated from the semiconductor substrate independent on whether the gate electrode is actually connected to gate potential during operation. Of course the gate electrode is insulated from other parts like the metal emitter contact as well.

In another possible structure of the semiconductor device, the IGBT-cell 110 and a diode-cell 120 are not separated from each other by a common trench gate electrode as illustrated in FIG. 1C, but have their p-type body and diode region laterally adjoined, which together are arranged between two neighboring trench gate electrodes 12, so that next to each IGBT-cell only one gate trench is arranged. According to FIG. 1C, every second trench would have to be omitted in this case.

This applies for a reverse conducting trench IGBT with at least one combined IGBT-cell 110 and diode-cell 120 arranged between two neighboring trench gate electrodes 12. The IGBT-cell 110 then includes a first portion of a p-type body region 2 in which the source region 3 and the anti-latch-up region 4 are embedded. The diode-cell 120 includes an adjoining second portion 2a of the same doping type (p) without any source region. For example, the second portion 2a contains no n-type semiconductor regions and thus forms a rectifying pn-junction 9a with the drift region 1 only.

A possible portion of the body region 2 is a portion D with a low doping dose, which will be explained later in detail.

The numbers and labels within FIG. 1C also apply for the consecutive figures if not specifically mentioned otherwise.

Figure 2:
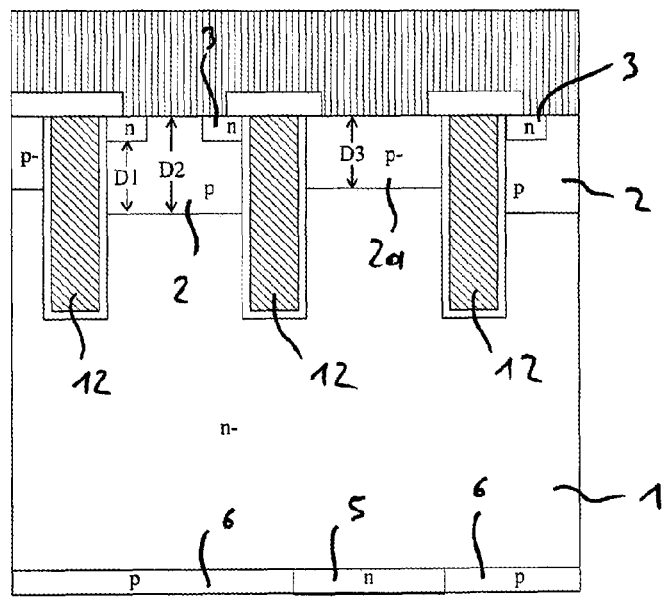
FIG. 2 schematically illustrates a vertical cross-section of a further semiconductor device, in particular a trench RC-IGBT containing separate transistor and diode cells and definitions of different doping doses in different portions.

In FIG. 2 several portions are defined, where the doping dose (unit: doping atoms per cm$^2$) is important. The doping dose is the integrated net doping concentration (net means in the p-doped area: acceptor concentration minus donator concentration or vice versa for n-doped regions) in direction of the current flow (e.g. vertically) across the according portion. D1 shows the doping dose inside that region of the body between the pn-junctions of the body region 2 to source region 3 and the pn-junction from the body region 2 to the drift region 1. D2 shows the doping dose inside that region of the body region 2 between the emitter contact 10 on the electrical contact interface of the body region at the main surface 15 and the drift region 1 in the IGBT-cell. If there is an optional diode cell, D3 shows the doping dose in that region of the diode region 2a between the emitter contact 10 on the electrical contact interface of the diode region 2a at the main surface 15 and the drift region 1.

These definitions are also applicable on cells formed with a contact trench. Depending on whether or not the contact trench reaches vertically below the source region, D1 may be lower or higher than D2. Furthermore the doping concentration during forming may change, thus influencing the doping dose.

So the doping dose of a portion may be influenced by the doping concentration which was applied during doping, the depth to which the dopants were implanted, the vertically thickness of the doped portion and the reduction of this thickness by forming a contact trench and thus diminishing the doped area.

In some embodiments, the discriminating line of the pn-junction between body or diode region and the drift region displays a measure for the doping dose as well as the depth up to which the dopant atoms reside within the substrate (e.g. for a vertically very homogeneously doped body region).

The doping dose of D2 and D3 might differ as well, if the body region 2 of the IGBT-cell has a different doping than the diode region 2a of the diode cell (see FIG. 2)

Within an IGBT-cell the electrons in diode conduction mode may flow from the drift region to the emitter contact 10 via the source region or directly from the body region 2, thus having two different current paths.

An optional highly doped anti-latch-up region 4 may be a part of the body region. Because this region is usually highly doped (with p+), it is unlikely that a current path with a low doping dose portion will include this region.

Decisive for the overall emitter efficiency may be the less doped of the mentioned portions with doping doses D1 or D2 within the body region. Also for absorbing the electrical field when blocking, the same portion may be decisive.

The doping dose of the less doped portion may be reduced to a value, where the robustness features do not deteriorate, e.g. maintaining the desired blockage voltage or the overcurrent turn-off behavior, for example.

Figure 3:
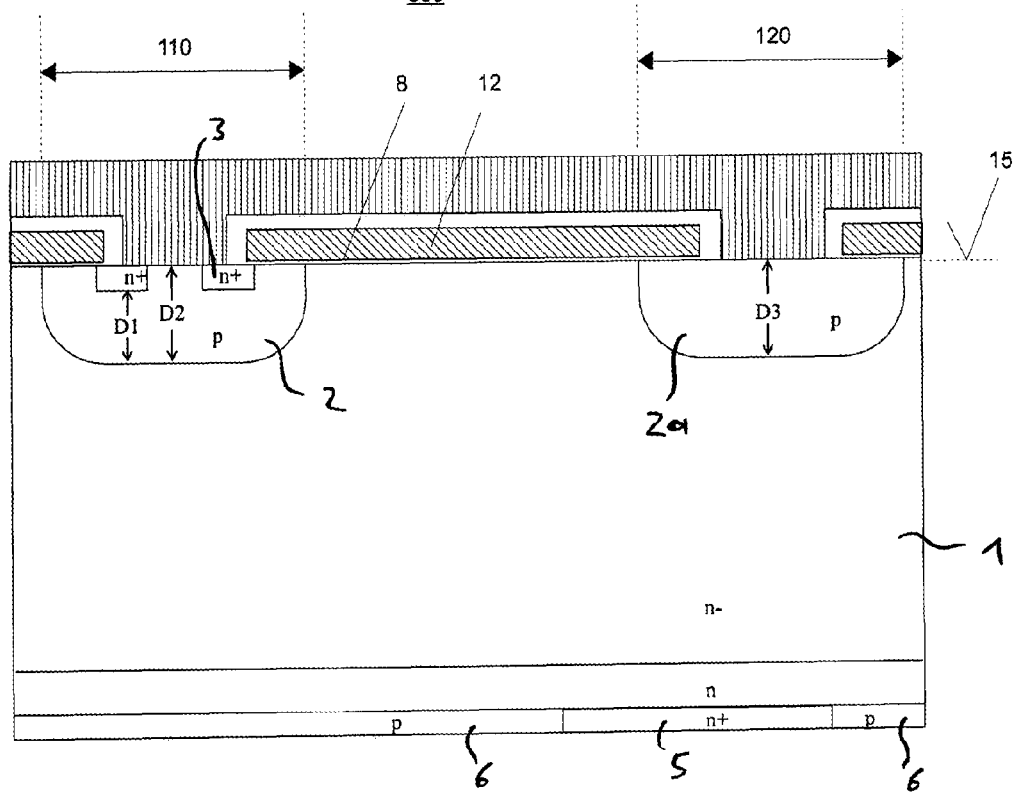
FIG. 3 schematically illustrates a vertical cross-section of a further semiconductor device, in particular a planar RC-IGBT containing separate transistor and diode cells and definitions of different doping doses in different portions.
Figure 7:
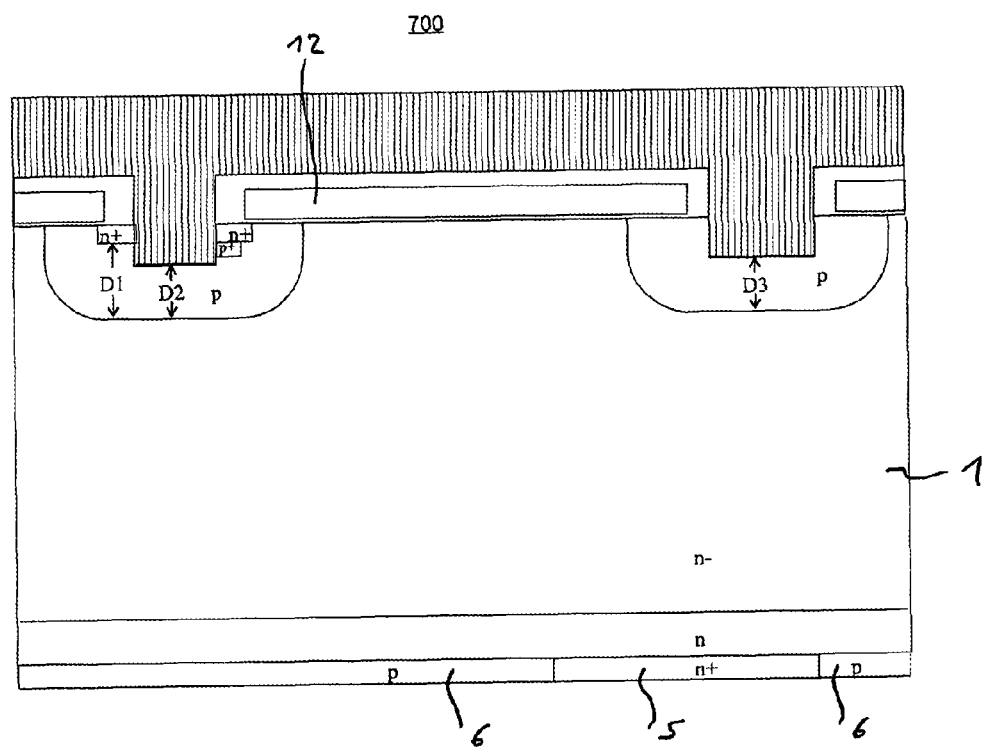
FIG. 7 schematically illustrates a vertical cross-section of a further semiconductor device, in particular a planar RC-IGBT containing separate transistor and diode cells and definitions of different doping doses in different portions, comprising a contact trench reaching below the anti-latch-up region.

FIG. 3 schematically illustrates an embodiment of a semiconductor device 300 in a section of a vertical cross-section. The semiconductor device 300 is similar to semiconductor device 100 and 200 and may also be operated as a reverse-conducting IGBT. However, the IGBT-cells 110 and the diode-cells 120 of the semiconductor device 300 include, instead of trench gate electrodes, planar gate electrodes 12 insulated by respective gate dielectric regions 8 (insulation) which are arranged on the main horizontal surface 15. The semiconductor device 300 may e.g. be formed as a DMOS-structure (double-diffused metal-oxide semiconductor). An optional anti-latch-up region may be implemented, as shown in FIG. 7.

A low doping dose portion or regions with doping doses D1, D2, D3 do not necessarily have to reach vertically into the substrate. The direction of the path with the least doping may be relevant for the current. E.g. doping dose D1 may reach from the source region horizontally to the drift region (near the gate insulation), if the doping dose is lower than in vertical direction.

When using an RC-IGBT with a planar cell arrangement, the doping dose D3 may be at least 1 time the breakdown charge.

In an embodiment, a semiconductor device comprises at least one field effect transistor structure 110, which is formed on a semiconductor substrate 40. The FET structure 110 comprises a drift region 1, a body region 2, a source region 3 and a gate 12. The source region 3 and the drift region 1 comprise at least mainly a first conductivity type (e.g. n-type), wherein the body region 2 comprises at least mainly a second conductivity type (e.g. p-type). The gate 12 is arranged so that the gate is capable of causing a conductive channel between the source region 3 and the drift region 1 through the body region 2. The body region 2 comprises at least one low doping dose portion with doping doses D1, D2 extending from the source region 3 or a electrical contact interface of the body region at a main surface 15 of the semiconductor substrate 40 to the drift region 1, wherein a doping dose within the low doping dose portion is less than 3 times the breakdown charge.

A doping dose less than 3 times the breakdown charge for the low doped portion with doping doses D1 or D2 within the body region 2 is proposed for RC-IGBT-cells, for example. This low doped portion resides between a source region 3 or metal contact surface 10, 15 and the drift region 1. A low p-emitter efficiency and thus low stored charge and low switching losses may be achieved. This measure may be supported by a special adaption of the thickness of the gate insulation (gate oxide). A suitable adaption of the insulation thickness when reducing the doping dose may result in a constant threshold voltage VGEth.

This structure can be part of an RC-IGBT. So in particular, the proposed structure can be applied for IGBTs or RC-IGBTs, either PT (punch through) or NPT (not punch through), but furthermore also to other devices, like MOSFETs. The latter may only differ on the backside structure.

In order to maintain a high breakdown voltage, at least a doping dose of 1 time the breakdown charge should be provided, if there are no other side effects taken into account, for example. Thus a doping dose between 1 and 3 times the breakdown charge for the low doping dose portion may be used.

To achieve a low emitter efficiency while maintaining robustness, the lowest doping dose may be only slightly higher than the breakdown charge.

Because of some side effects it may be possible to lower the doping dose even further. Such a side effect may be that the electrodes within the trenches (in particular the gate electrodes, but not limited to the gate potential) show effect as a field plate like in a capacitor. They aid in reducing the electrical field within or already below the body or diode region. Thus, the remaining charge required to stop the electric field within the body or diode region may be less than without this effect. So it may be possible to have a doping dose less than 1 time the breakdown charge for the low doping dose portion.

In another embodiment the low doping dose portion has a lateral extension of at least 20% of the lateral extension of that part of the body region of the at least one field effect transistor structure adjoining the electrical contact interface of the body region at the main surface or source region.

To make sure that the desired effect of the low doping dose portion shows the effect of a reduced emitter efficiency, a certain width or thickness or lateral extension of this portion may be necessary. For that reason a width of 20% (or 10%, 40%, 60%, 80% or 100%) of the effective contacted area may be used.

The contacted area is that part of the main surface which has a (e.g. ohmic) contact between the body or source region and the emitter connection (e.g. a contact metal layer).

Optionally, alternatively or additionally to one or more aspects described above, a first doping portion with doping dose D1 extends inside the body region 2 between the source 3 and drift region 1 and a second doping portion with doping dose D2 extends inside the body region 2 between the electrical contact interface of the body region at the main surface 15 and drift region 1. The low doping dose portion is at least one of the first doping portion with doping dose D1 or second doping portion with doping dose D2 and the other doping portion comprises a higher doping dose than the low doping dose portion.

In another embodiment a diode region 2a is arranged at the main surface 15 of the semiconductor substrate 40 comprising the second conductivity type p and forming a pn-junction 9a with the drift region 1 separated from the body region 2 and a third doping portion D3 extending inside the diode region 2a between the electrical contact interface of the body region at the main surface 15 and drift region 1.

The main surface builds up the electrical contact interface between the semiconductor substrate towards a metalized emitter contact.

If the RC-IGBT contains diode cells, i.e. cells without a source region, the doping dose D3 may deviate by less than a factor of 2 from the lower of the values of D1 and D2, for example.

In another embodiment the doping dose of the third doping portion D3 differs from the doping dose of the first doping portion with doping dose D1 or second doping portion with doping dose D2.

In other embodiments several doping portions might have the same doping dose like the low doping dose portion.

In another embodiment of the semiconductor device, the first doping portion extends vertically deeper into the drift region, than the second doping portion.

Figure 4:
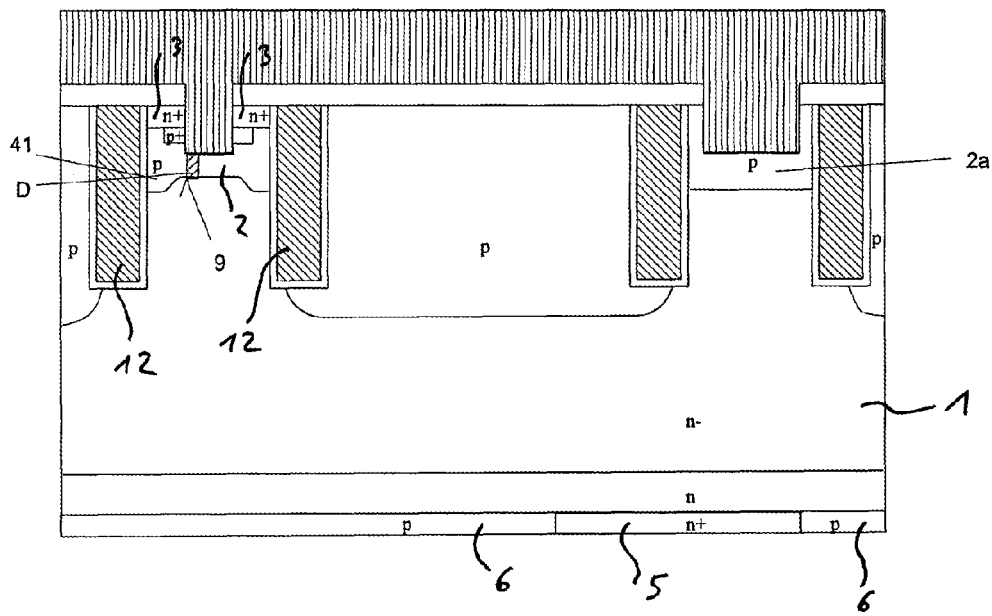
FIG. 4 schematically illustrates a vertical cross-section of a further semiconductor device, in particular a trench RC-IGBT containing a flat or less doped pn-junction underneath the contact trench.

FIG. 4 schematically illustrates a semiconductor device 400 in a section of a vertical cross-section. The first doping portion 41 reaches below the source region along the gate insulation layer to the drift region. Here the doping was injected deeper into the substrate or the doping concentration was higher, to receive a higher doping dose.

The doping dose D2 is lower than the one D1 by implanting a lower dose into the body region underneath the metal surface than in the region underneath the source region. Thus the pn-junction 9 in the portion with doping dose D2 lies less deep in the substrate. As an additional aspect, D2 might coincide with D3 of an optional diode region 2a. An example low doping dose portion D is depicted.

In another embodiment the semiconductor device comprises a contact trench reaching into the body region. Further, a contact metal layer on top of the main surface is in contact with the body region at the bottom of the contact trench.

Furthermore, contact trenches reaching into the cell areas could once more reduce the effective p dose in the diode mode.

Figure 5:
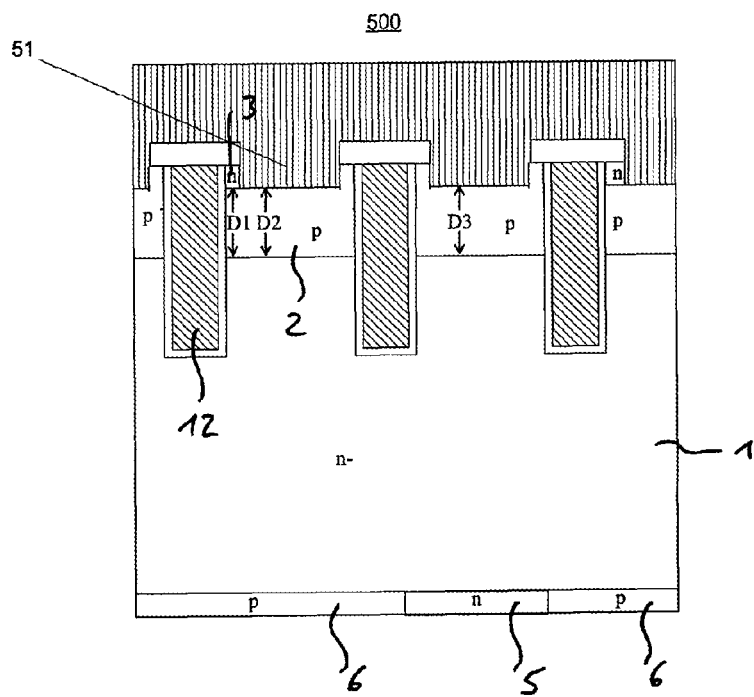
FIG. 5 schematically illustrates a vertical cross-section of a further semiconductor device, in particular a trench RC-IGBT containing separate transistor and diode cells comprising a contact trench and definitions of different doping doses in different portions.

FIG. 5 shows shallow contact trenches 51, which are used to electrically connect the source regions 3 and the first electrode 10. The shallow contact trenches 51 may alternatively also be used for the semiconductor devices explained with reference to other figures.

In another embodiment the semiconductor device comprises an anti-latch-up region (not shown) of the second conductivity type in contact with the source region 3. This region has a maximum doping concentration which is higher than a maximum doping concentration of the body region 2, wherein the anti-latch-up region is arranged at least partly below the source region 3.

In another embodiment (see FIG. 6) the bottom 62 of the contact trench 61 extends vertically deeper than the bottom 63 of the anti-latch-up region 4.

Figure 6:
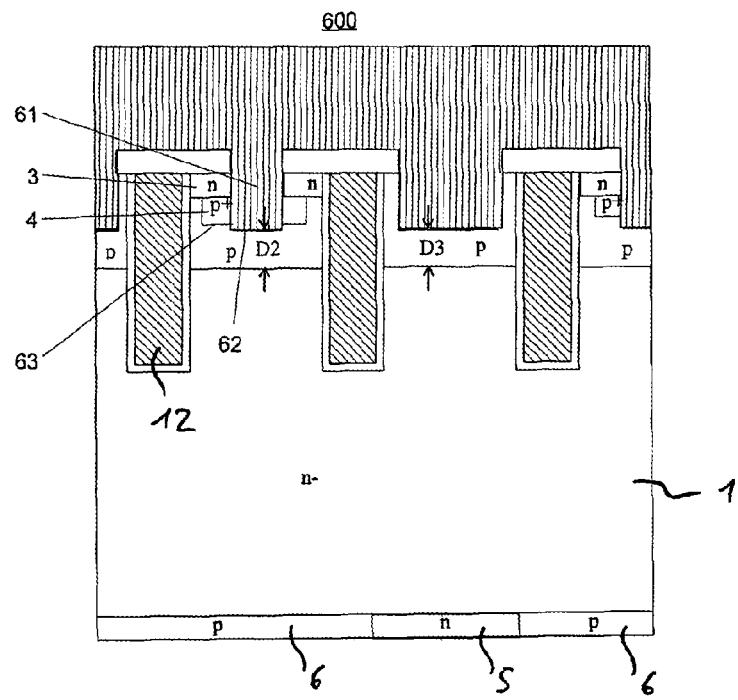
FIG. 6 schematically illustrates a vertical cross-section of a further semiconductor device, in particular a trench RC-IGBT containing separate transistor and diode cells comprising a contact trench reaching below an anti-latch-up region and definitions of different doping doses in different portions.

FIG. 6 shows a trench type IGBT including an anti-latch-up region 4 with a highly doped p+ region underneath and connected to the source region. This highly doped region should not contribute to the emitter efficiency of the body region.

This is achieved by forming a contact trench 61, lowering the electrical contact interface of the body region at the main surface to the bottom of the trench 62, having the metal emitter 61 connected deep into the body region, thus forming a low doping dose portion with doping dose D2.

Even when doping the whole body region with the same doping concentration (which may facilitate the production of such a semiconductor) the doping dose D2 can be reduced by forming such a contact trench 61 which takes away some of the doped substrate.

The anti-latch-up region on the other hand might increase the doping dose of the doping portion with doping dose D1 due to its higher doping concentration. A contact trench may let the electrons easily bypass the anti-latch-up and source region in reverse mode. An inaccurate position or doping of the anti-latch-up region (which might occur in simplified forming processes) would not have any effect on the reverse mode capabilities, because the contact trench reaches deeper than the anti-latch-up region, for example.

FIG. 7, shows a planar gate type IGBT including a p+ doped anti-latch-up region. Forming a contact trench into the body region has the same effect as described for FIG. 6.

In another embodiment the semiconductor device comprises a gate area, wherein the gate area is insulated from the body region, source region and drift region, wherein at least one section of the insulation may have up to 10 times (up to 5 times or up to 2 times) the thickness of a channel section of the same insulation layer or the insulation layer of another gate area.

VGEth may be defined as voltage which may be between gate 12 and emitter 10 and collector 11 and emitter 10 in order to have a current density flow of e.g. 5 mA/cm$^2$ at a temperature of 25° C.

VGE is the difference of the previously mentioned voltages VG and VE, "th" is the designation for the so called threshold voltage.

The threshold voltage VGEth of the conductive channel (MOS channel) has to be kept in a suitable range for IGBTs (e.g. approximately 6 Volts or 4 Volts). Using a low dose for the doping of the body region usually results in a low threshold voltage. Therefore the thickness of the gate insulation layer (often silicon oxide is used as material) may be increased to compensate for this effect.

The (partly) thicker gate insulation may further reduce the gate capacity. This may result in lower necessary gate currents and switching losses.

Depending on the application and the desired electrical characteristic of the device, the thickness of the different sections of the insulation may be determined.

In another embodiment, the thickness of one section of the insulation layer has up to 2 times the thickness of the channel section of the insulation layer.

In another embodiment, where an emitter area connects the body and source region, at least a section of the insulation layer of the gate electrodes is made of silicon oxide with a thickness between 150 nm and 300 nm or between 25 nm*VGEth/V and 50 nm*VGEth/V. VGEth is the threshold voltage between gate and emitter as defined above.

When using silicon oxide as insulation material a thickness of 80-120 nm may be used. Increased values might be 150-300 nm. Otherwise this thickness may be calculated by taking the threshold voltage into account, lying between 25 nm*VGEth/V and 50 nm*VGEth/V, for example.

In another embodiment of a semiconductor device 1200 the gate area is insulated from the body, source and drift region. The thickness of the section of the insulation layer facing the source and/or body region 121 differs from the thickness of the section facing the drift region 122.

Figure 11:
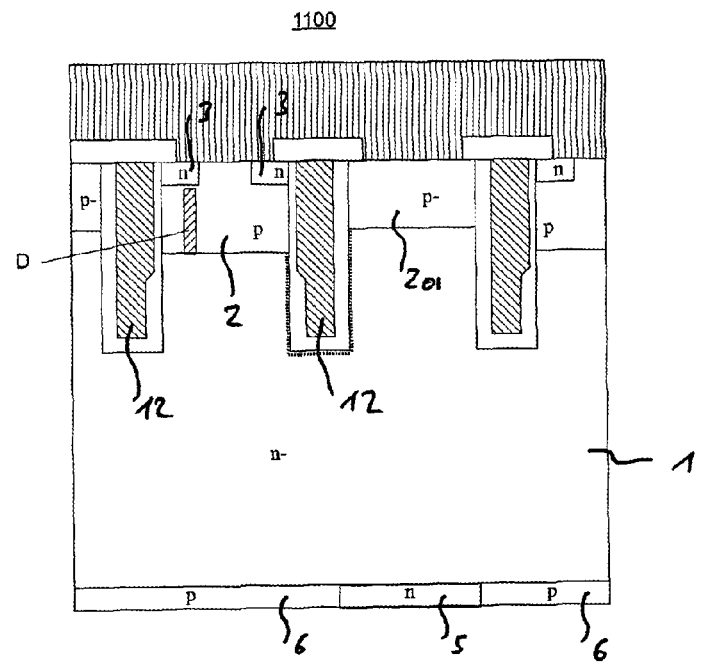
FIG. 11 schematically illustrates a vertical cross-section of a further semiconductor device, in particular a trench RC-IGBT containing thicker insulation outside the channel region of the IGBT cell.
Figure 12:
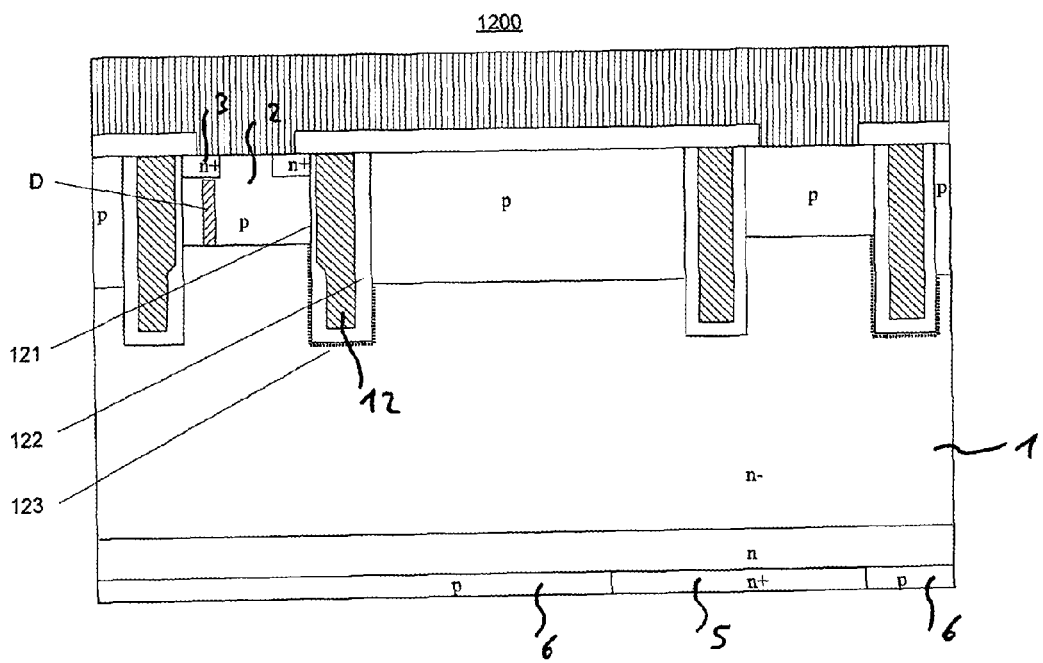
FIG. 12 schematically illustrates a vertical cross-section of a further semiconductor device, in particular a trench RC-IGBT containing thicker insulation outside the channel region of the IGBT cell, comprising further a inter cell area.

FIG. 11 and FIG. 12 show such a structure. FIG. 12 has an additional inter cell area, which will be described later.

Figure 9:
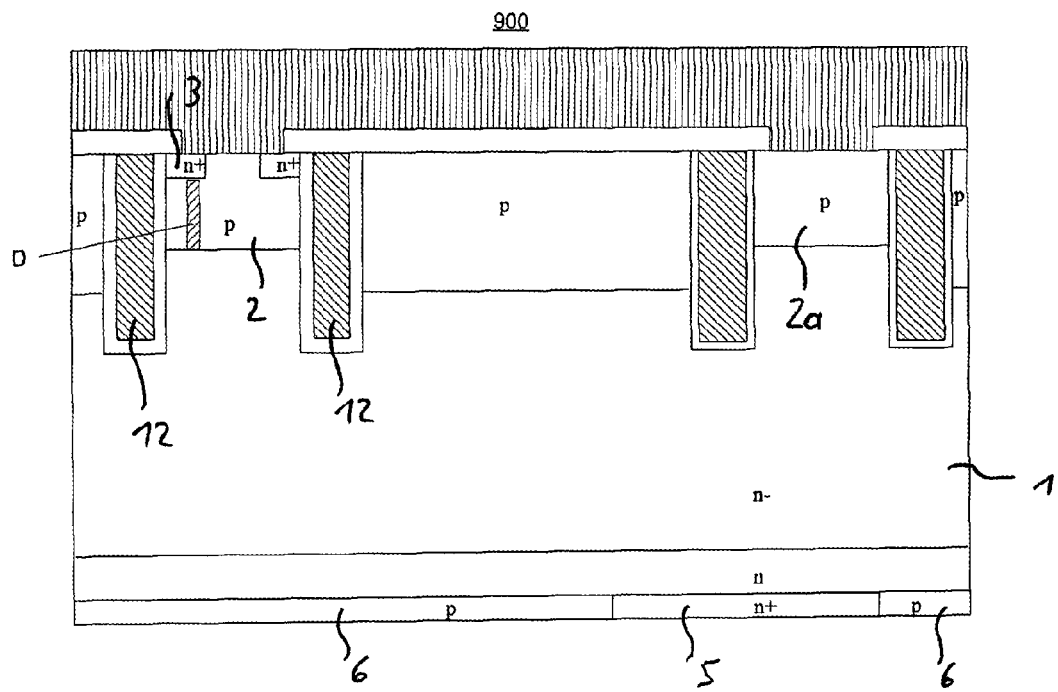
FIG. 9 schematically illustrates a vertical cross-section of a further semiconductor device, in particular a trench RC-IGBT containing insulation layers with different thicknesses.

A further effect may occur, if a negative gate voltage (with respect to source voltage) is applied while in diode (reverse) mode. Then a (hole) inversion layer is formed close to the trenches within the n-doped drift region (see dotted line 123 in FIG. 12). This layer acts as p-emitter, the more, the higher the hole concentration is. Also this effect increases the stored charge carrier plasma during diode mode, thus increasing switching losses. Increasing the thickness of the insulation in the appropriate regions may be a possible measure to avoid this. On the other hand this effect may be used for good, to attain a low diode forward voltage, while having a negative gate voltage. Therefore the insulation of the diode side trenches may be thin, as shown in FIG. 9. There it may be assumed, that the potential within the diode trenches is connected to gate potential.

In another embodiment of a semiconductor device, the gate area is insulated from the body, source and drift region, a diode region of the second conductivity type forming a pn-junction with the drift region separated from the body region, wherein the thickness of a section of the insulation layer facing the source or body region differs from the thickness of the section facing the diode region.

FIG. 9 shows an arrangement, where the insulation of the FET-side trenches is thicker than the diode side trenches.

Figure 10:
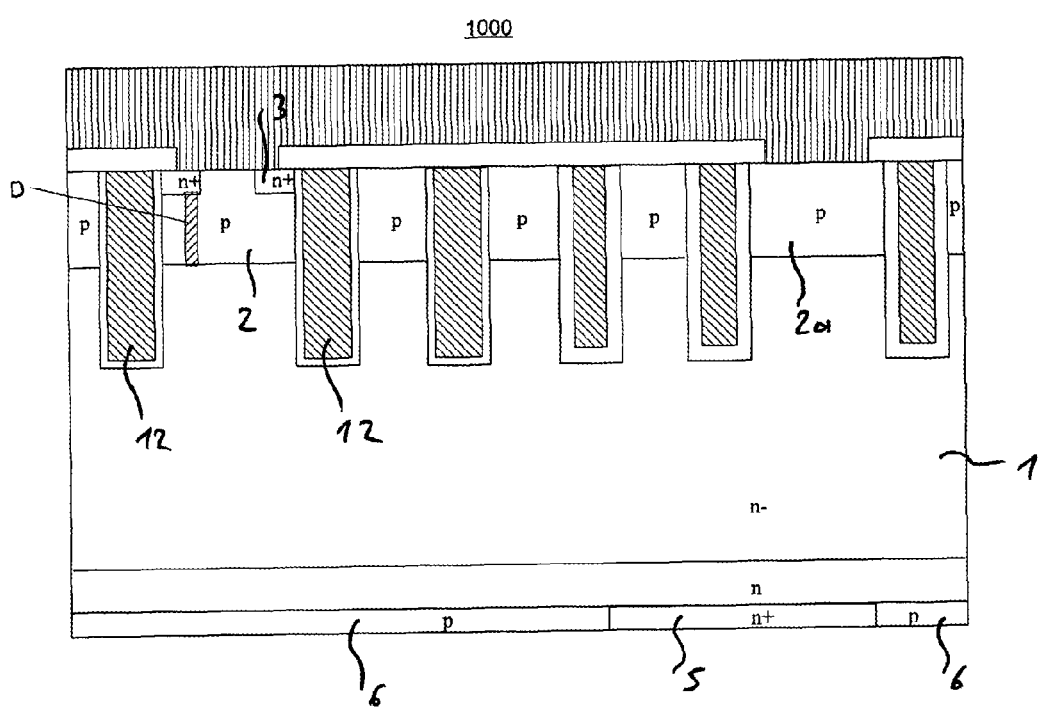
FIG. 10 schematically illustrates a vertical cross-section of a further semiconductor device, in particular a trench RC-IGBT containing a inter cell area with spacer trenches residing therein, having different thicknesses of insulations.

FIG. 10 shows the opposite arrangement, where the insulation of the FET-side trenches is thinner than the diode side trenches.

FIG. 12 shows an arrangement, where only the section facing the FET-part has a thin insulation and the parts facing the diode region or drift region have a thick insulation.

In another embodiment the semiconductor device comprises a plurality of gate trenches reaching vertically from the electrical contact interface of the body region at the main surface to the drift region, separating the one or multiple body regions from one or multiple diode regions. The at least one gate of the at least one field effect transistor structure is arranged within at least one of the plurality of gate trenches, wherein the gate area is insulated from the body region, source region and drift region.

Figure 8:
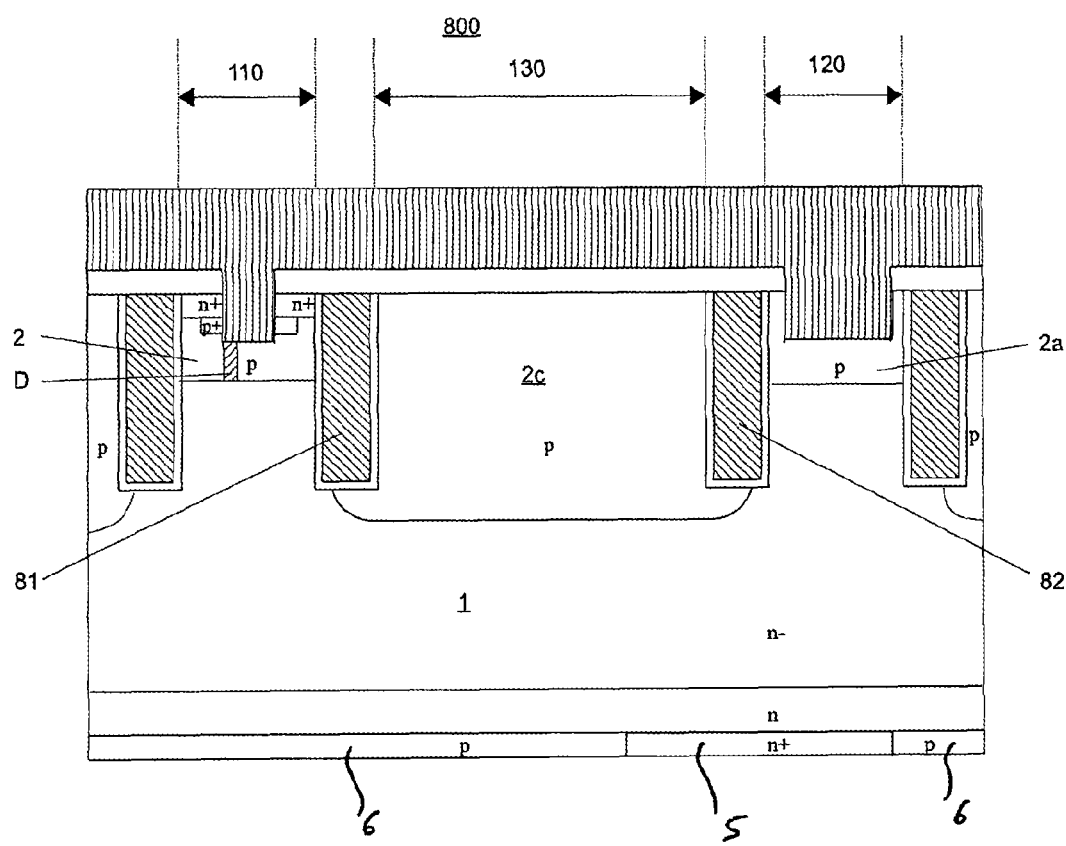
FIG. 8 schematically illustrates a vertical cross-section of a further semiconductor device, in particular a trench RC-IGBT containing an inter cell area.

In another embodiment the semiconductor structure 800 of FIG. 8 comprises at least one gate trench 81, which contains a gate of the at least one field effect transistor structure 110 situated between the body region 2 and an inter cell area 2c.

A diode trench 82 contains a filled area filled by floating electrically conductive material, electrically connectable or connected to the gate or a predefined potential and is situated between the inter cell area 2c and the diode region 2a. This filled area of the diode trench 82 is insulated from the inter cell area, diode region and drift region.

FIG. 8 as well as 9, 10, 12 show trench IGBTs, where the single IGBT and diode cells 120 are not besides each other (only separated by gate trenches), but comprise an inter cell structure 130 as additional separation. The associated inter cell areas 2c may contain floating doping regions.

An example low doping dose portion D is depicted within these figures.

Structures may have a layout of a stripe structure, or such that the cells form squares or other polygons, forming a regular grid within a connected inter cell area.

In the exemplary embodiment illustrated in FIG. 8, the body region 2 of the IGBT cell 110 extends between the first vertical trench and the second vertical trench (gate trench) 81. The floating body region 2c of the inter cell structure 130 extends between the second vertical trench 81 and the third vertical trench (diode trench) 82. The diode region 2a of the diode-cell 120 extends between the third vertical trench 82 and a fourth vertical trench. A maximum doping concentration of the floating semiconductor area 2c is for example substantially equal to or higher than the maximum doping concentration of the body region 2.

According to an embodiment, the floating semiconductor area 2c extends vertically deeper into the drift region 1 than the body regions 2, the anode regions 2a, and the vertical trenches 81 and 82 as shown in FIG. 8. The floating area usually has a doping of the second conductivity type (here p).

In another embodiment the thickness of the insulation of the gate area within the gate trench differs from the thickness of the insulation of the filled area within the diode trench.

FIG. 9 and FIG. 10 are showing a difference in the thickness of each trench type (gate or diode trench), but as a whole. So the insulation within each trench has a constant thickness.

In another embodiment the semiconductor comprises at least a spacer trench containing a filled area. It is situated within or interrupting the inter cell area between a distant gate and diode or second gate trench, wherein the thickness of the insulation within the spacer trench differs from the thickness of the insulation within the gate or diode trench.

FIG. 10 shows such an arrangement including trenches within the inter cell area.

These trenches filled with electrodes split up the floating region into several inter cell areas. These additional trenches within the inter cell area might have different thicknesses of insulations themselves. This will depend on their usage, one option is to apply the gate potential to all of them. Alternatively, they may be connected to the emitter electrode 10.

The thickness of each individual insulation layer of the spacer trenches may be the same as the thickness for the insulation of the gate trench or the same as the thickness for the insulation of the diode trench. Also the thickness may be the same as the one of the closest gate or diode trench. The latter is shown in FIG. 10.

Some embodiments relate to a semiconductor device comprising as a first part at least one field effect transistor structure formed on a semiconductor substrate. This includes a drift region, at least one body region, at least one source region, at least one gate. The source region and the drift region comprise at least mainly a first conductivity type and the body region comprises at least mainly a second conductivity type. The gate is arranged so that the gate is capable of causing a conductive channel between the source region and the drift region through the body region. The semiconductor further comprises as a second part an inter cell area of the second conductivity type and as a third part a diode region of the second conductivity type forming a pn-junction with the drift region separated from the body region.

A gate trench reaches vertically from the main surface to the drift region, separating the first and second part, wherein at least one gate of the at least one field effect transistor structure is arranged within the gate trench. This gate area is insulated from the body region, source region and drift region. Furthermore a diode trench containing a filled area filled by floating electrically conductive material, electrically connectable or connected to the gate or a predefined potential, reaches vertically from the main surface to the drift region, separating the second and third part. The filled area is insulated from the body, source and drift region.

The thickness of the insulation of the gate area within the gate trench differs from the thickness of the insulation of the filled area within the diode trench.

The semiconductor device may comprise one or more optional, additional features corresponding to one or more aspects mentioned in connection with the proposed concept or one or more embodiments described above (e.g. FIGS. 1a and 1b).

FIG. 9 and FIG. 10 are showing a difference in the thickness of each trench type (gate or diode trench).

Some embodiments relate to a semiconductor device comprising at least one field effect transistor structure formed on a semiconductor substrate. This includes a drift region, at least one body region, at least one source region and at least one gate, wherein the source region and the drift region comprise at least mainly a first conductivity type. The body region comprises at least mainly a second conductivity type and the gate is arranged so that the gate is capable of causing a conductive channel between the source region and the drift region through the body region. The semiconductor further comprises a diode region of the second conductivity type forming a pn-junction with the drift region separated from the body region. The diode region comprises at least one low doping dose portion extending from an electrical contact interface of the diode region at a main surface of the semiconductor substrate to the drift region, wherein a doping dose within the low doping dose portion is less than 3 times the breakdown charge.

The semiconductor device may comprise one or more optional, additional features corresponding to one or more aspects mentioned in connection with the proposed concept or one or more embodiments described above (e.g. FIGS. 1a and 1b).

FIG. 2 shows a diode region 2a with a low doping dose portion according to the depiction. For numbers not depicted see FIG. 1C.

A doping dose less than 3 times the breakdown charge for the low doped portion D3 within the diode region 2a may be used for RC-IGBT-cells. This low doped portion resides between a metal contact surface 10, 15 and the drift region 1. A low p-emitter efficiency and thus low accumulation charge and low switching losses may be achieved. This measure may be supported by a special adaption of the thickness of the gate insulation (gate oxide).

Some embodiments relate to a method for forming a semiconductor device according to the proposed concept or one or more embodiments described above.

Some embodiments relate to an RC-IGBT with low body doping.

The usually monolithically integrated IGBT in forward mode and the first integrated free wheeling diode use the common (usually p doped) body region, thus forming an RC-IGBT (reverse conducting insulated gate bipolar transistor). For conduction in reverse mode, the p-body region acts as p-emitter when operating as diode. A high doping concentration of said emitter results in a high charge carrier plasma in then base. The charge carrier plasma should be low, in order to reduce switching losses, i.e. the reverse current peak and the reverse recovery energy of the semiconductor device 100 and the switching-on energy of the IGBT-cells 110. On the other hand, the doping concentration of the p body region should be high enough, to provide the threshold voltage for the conductive channel (MOS channel).

Further, the gate capacity of the RC-IGBT may be reduced to keep the control power low. This may be enabled by increasing the thickness of gate insulation layers in RC-IGBTs.

As a secondary condition, the robustness and durability against over current, high voltages and short-circuit strength may be kept high.

A proposed structure may reduce the emitter efficiency of the p-body region of the IGBT cells, maintaining the possible threshold voltage and reducing the input capacitance, without reducing the robustness.

The p-emitter efficiency is the ratio of hole current to total current flowing across the pn-junction. Reducing the hole current results in a lower emitter efficiency. This can be achieved by less doping of the p-body-region.

The mentioned variant of an RC-IGBT (see FIG. 1C) comprises diode cells 120 besides the IGBT-cells 110 including a source region 3. These separate diode-cells 120, contain the diode region 2a, functioning as an anode region for the diode function (in reverse mode). The latter only serve to permit passage for the electrons coming from the back side 11 to the front side contact 10 using and passing a p-doped region of a low emitter efficiency. For this purpose, the p-region (diode region 2a) of these cells 120 is particularly low doped (FIG. 1C). Furthermore contact trenches reaching into the cell areas could once more reduce the effective p dose in the diode mode.

Normal IGBTs do not conduct electrical current backwards in contrast to MOSFETs, for example. Therefore, an IGBT module may comprise an anti-parallel free-wheeling diode, which conducts the current in backward direction. In some examples, this function is implemented by additional n-emitter regions at the backside of the IGBT, which is the called RC-IGBT, for example.

A proposed device may provide an improvement in the diode operation. For example, the stored charge, which is important for the switching losses in an IGBT or diode during commutating the diode, may be reduced.

Figure 13:
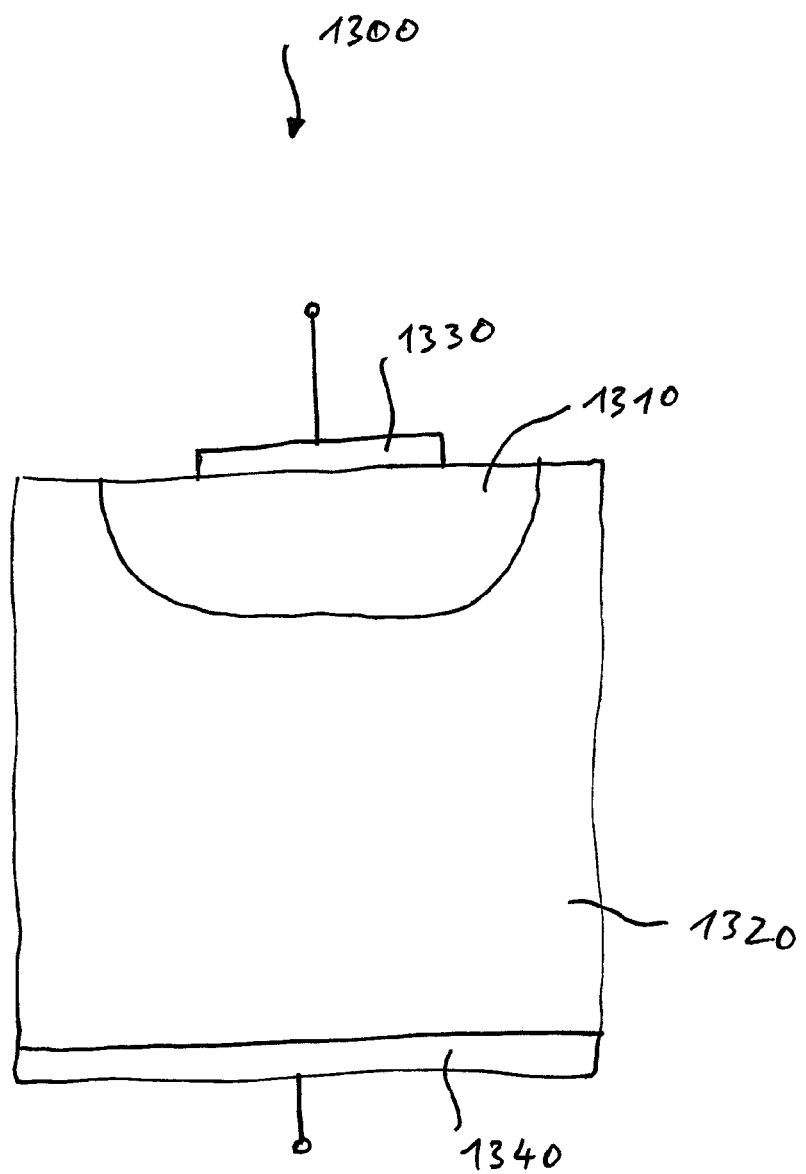
FIG. 13 shows a schematic illustration of a semiconductor device.

FIG. 13 shows a schematic cross section of a semiconductor device according to an embodiment. The semiconductor device 1300 comprising a first doping region 1310 extending from a main surface of a semiconductor substrate into the semiconductor substrate. The first doping region 1310 comprises a first conductivity type (p-doping or n-doping). Further, the semiconductor device 1300 comprises a second doping region 1320 arranged adjacent to the first doping region 1310. The second doping region 1320 comprises a second conductivity type (n-doping or p-doping). The first doping region 1310 comprises at least one low doping dose portion extending from the main surface of the semiconductor substrate to the second doping region 1320. A doping dose within the low doping dose portion of the first doping region 1310 is less than 3 times a breakdown charge. Additionally, the semiconductor device 1300 comprises a first electrode structure 1330 in contact with the first doping region 1310 at the main surface of the semiconductor substrate. The work function of the first electrode structure 1330 at the main surface of the semiconductor substrate is larger than 4.9 eV or lower than 4.4 eV. Further, the semiconductor device 1300 comprises a second electrode structure 1340 in contact with the second doping region.

By using a material for the first electrode structure with a work function larger than the work function of the first doping region, leakage currents of the semiconductor device may be reduced, although the first doping region comprises a very low doping concentration. Switching losses of the semiconductor device may be reduced due to the very low doping concentration within the first doping region. Further, an ohmic contact between the first electrode structure and the first doping region may be obtained, since the first electrode structure comprises a work function larger than the work function of the first doping region. Furthermore, additional life time engineering may be avoided or may be reduced due to the very low doping concentration within the first doping region.

The semiconductor substrate of the semiconductor device 1300 may be a silicon-based semiconductor substrate, a silicon carbide-based semiconductor substrate, a gallium arsenide-based semiconductor substrate or a gallium nitride-based semiconductor substrate, for example. The semiconductor substrate of the semiconductor device 1300 may be a wafer, part of a wafer or a semiconductor die.

A main surface of the semiconductor substrate may be a semiconductor surface of the substrate towards metal layers, insulation layers or passivation layers on top of the semiconductor surface. In comparison to a basically vertical edge (e.g. resulting from separating the semiconductor dies from others) of the semiconductor structure, the main surface of the semiconductor structure may be a basically horizontal surface extending laterally, although trenches (e.g. insulation trenches, gate trenches) may be arranged on the basically horizontal surface. In other words, the main surface of the semiconductor substrate may be the interface between the semiconductor material and an insulation layer, metal layer or passivation layer on top of the semiconductor substrate.

The first doping region 1310 of the first conductivity type may comprise a p-doping (e.g. caused by incorporating aluminum ions or boron ions) or an n-doping (e.g. caused by incorporating nitrogen ions, phosphor ions or arsenic ions). Consequently, the second conductivity type indicates an opposite n-doping or p-doping. In other words, the first conductivity type may indicate an p-doping and the second conductivity type may indicate a n-doping or vice-versa.

The first doping region 1310 may represent the anode (or cathode) of a diode (e.g. FIG. 13 or 14) or the source/drain region or body region of a transistor structure (e.g. FIGS. 1a to 12). The first doping region 1310 comprises a very low doping concentration within at least a low doping dose portion. The doping dose within the low doping dose portion is less than 3 times a breakdown charge (or below 2 times or below 1 time the breakdown charge). The doping dose within the low doping dose portion may be equal to an integral or a sum over a net doping concentration (acceptors minus donators or vice versa) along a path characteristic for the low doping dose portion extending from the main surface of the semiconductor substrate to the second doping region 1320. The characteristic path may be a path between the main surface of the semiconductor substrate and the second doping region 1320 comprising the lowest doping dose. For example, the doping dose within the low doping dose portion may be a doping dose per area implanted or diffused into the first doping region 1310 or the doping dose along a vertical path through the first doping region 1320. The doping dose along a vertical path through the first doping region 1320 may be equal or less than a number of dopants per area implanted during the implantation of the first doping region 1320.

The breakdown charge may be a breakdown charge of the semiconductor material of the semiconductor substrate. In other words, the size of the breakdown charge may depend on the used semiconductor material. For example, the breakdown charge of silicon may be $1.3E12/cm^2$. Consequently, a doping dose within the low doping portion may be less than $3.9E12$ doping atoms/$cm^2$ for a silicon substrate. For example, the breakdown charge of a silicon carbide substrate may be approximately $1E13/cm^2$ and correspondingly a doping dose within the low doping portion may be less than $3E13$ doping atoms/$cm^2$ for a silicon carbide substrate.

For example, the first doping region 1310 may comprise a (maximal, average or edge) doping concentration below $1*10^{16}$ cm$^{-3}$ (or below $1*10^{17}$ cm$^{-3}$ or below $3*10^{16}$ cm$^{-3}$).

The second doping region 1320 is arranged adjacent to the first doping region 1310 so that a pn-junction exists between the second doping region 1320 and the first doping region 1310. The second doping region 1320 may represent the cathode (or anode) of a diode (e.g. FIG. 13 or 14) or the source/drain region or body region of a transistor structure (e.g. FIG. 1a to 12).

For example, the first doping region 1310 may be a p-doped anode region of a diode and the second doping region 1320 may be an n-doped cathode region of the diode.

For example, the first doping region 1310 and the second doping region 1320 may implement a bipolar diode between the first electrode structure and the second electrode structure. A bipolar diode may be a diode with electrons and electron holes contributing significantly to the current through the diode in a conducting state. For example, more than 5% (or more than 10% or more than 20%) of the current through the bipolar diode may be caused by minority charge carriers. In comparison, a Schottky diode may be an unipolar diode, for example.

The first electrode structure 1330 is in contact with the first doping region 1310 at the main surface of the semiconductor substrate. The first electrode structure 1330 may be a metal structure deposited on the main surface of the semiconductor substrate. The first electrode structure 1330 may comprise one or more layers. For example, the first electrode structure 1330 may comprise a silicide layer (e.g. platinum silicide or iridium silicide) in contact with the semiconductor substrate followed by a metal layer (e.g. copper or aluminum).

Figure 16:
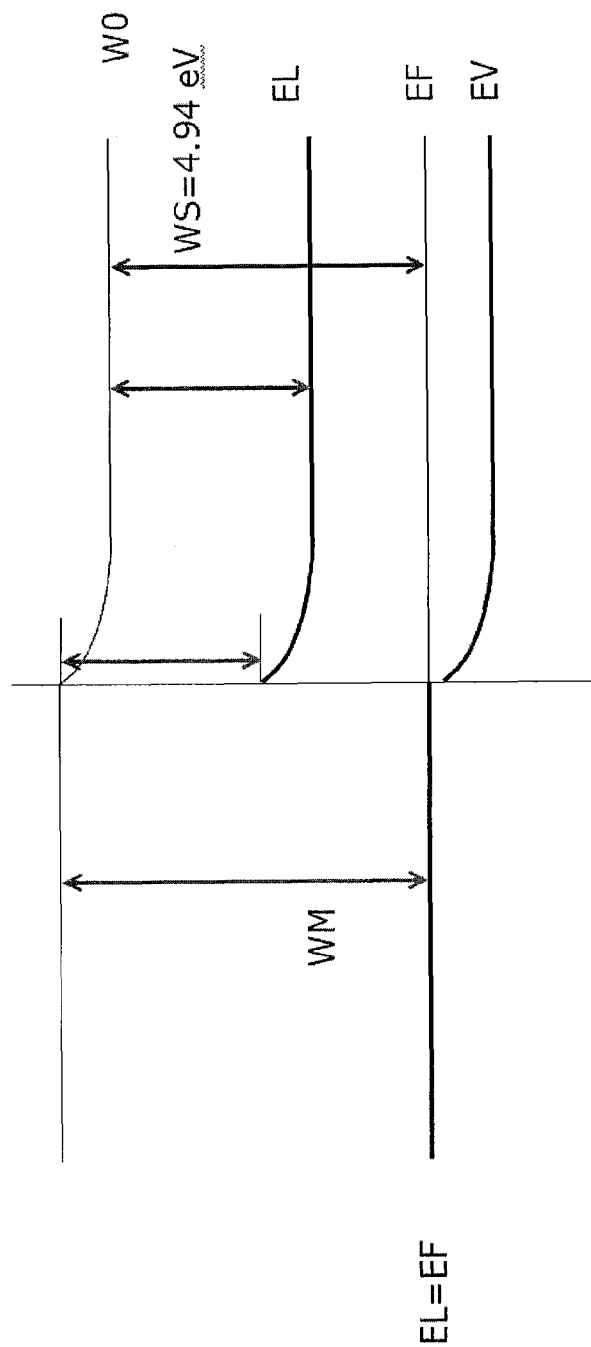
FIG. 16 shows a band structure of a metal-semiconductor transition.

An ohmic contact between the first electrode structure 1330 and the first doping region 1310 may be established, since the work function of the first electrode structure 1330 is higher than the work function of the first doping region 1310. The work function may be a minimum thermodynamic work (energy) needed to remove an electron from a solid to a point in the vacuum outside the solid surface. FIG. 16 shows an example of a band structure of a metal-semiconductor transition for a lightly p-doped silicon in contact with a metal, which comprises a work function WM>WS (work function of silicon, e.g. WS=4.94 eV). The energy level of the valence band EV, the energy of the conduction band EL and the Fermi level EL are illustrated with the metal at the left side and the silicon on the right side.

Figure 17:
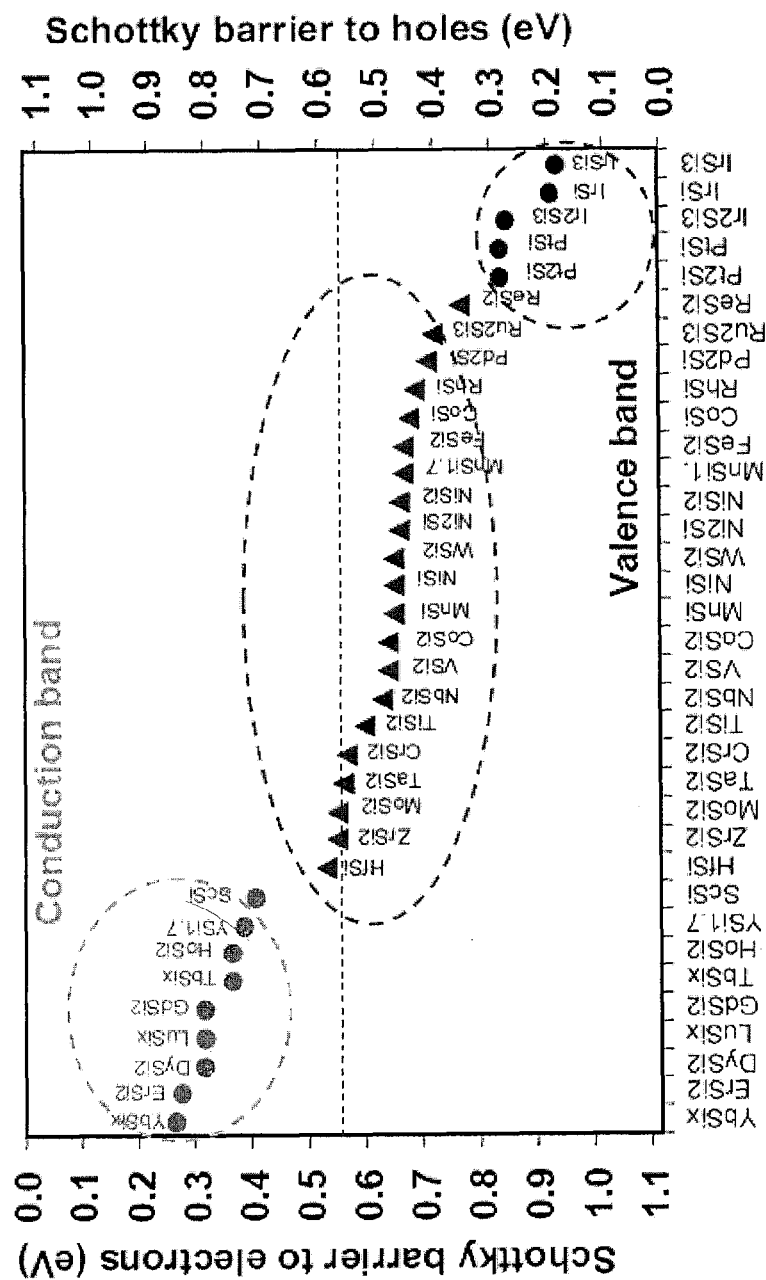
FIG. 17 shows Schottky barriers for electrons and holes in silicon for different silicides.

For example, the work function of the first electrode structure 1330 at the main surface of the semiconductor substrate may be larger than 4.9 eV (or larger than 4.7 eV or larger than 5 eV), if the first doping region 1310 is a p-doped region. For example, a Schottky barrier between the first electrode structure 1330 and the first doping region 1310 may be lower than 0.3 eV (or lower than 0.4 eV or lower than 0.2 eV) for holes, if the first doping region 1310 is a p-doped region. For example, the first electrode structure 1330 may comprise platinum silicide or iridium silicide (e.g. a platinum silicide layer or iridium silicide layer in contact with the semiconductor substrate), if the first doping region 1310 is a p-doped region. Alternatively, the work function of the first electrode structure 1330 at the main surface of the semiconductor substrate may be lower than 4.4 eV (or lower than 4.5 eV or lower than 4.3 eV), if the first doping region 1310 is an n-doped region. For example, a Schottky barrier between the first electrode structure 1330 and the first doping region 1310 may be lower than 0.4 eV (or lower than 0.3 eV) for electrons, if the first doping region 1310 is an n-doped region. For example, the first electrode structure 1330 may comprise gadolinium silicide, lutetium silicide, dysprosium silicide, erbium silicide or ytterbium silicide (e.g. a gadolinium silicide layer, a lutetium silicide layer, a dysprosium silicide layer, an erbium silicide layer or a ytterbium silicide layer in contact with the semiconductor substrate), if the first doping region 1310 is an n-doped region. FIG. 17 shows Schottky barriers for electrons and holes in silicon for different silicides. For example, Pt2Si, PtSi and Ir2Si3 may have a Schottky barrier lower than 0.3 eV and IrSi and IrSi3 may have a Schottky barrier lower than 0.2 eV for electron holes.

For example, additional life time engineering may be avoided or may be reduced due to the very low doping concentration within the first doping region 1310. For example, an additional heavy metal diffusion (e.g. platinum or gold), an additional electron irradiation and/or proton irradiation may be avoided, which would reduce a charge carrier life time within the semiconductor substrate. Such life time engineering may increase the leakage currents at high operation temperatures. In other words, the charge carrier life time within the semiconductor substrate of a proposed semiconductor device 1300 may be high due to a reduced or avoided charge carrier life time adjustment. For example, a charge carrier life time within at least a part of the second doping region 1320 (e.g. drift region) is longer than 10 µs (or longer than 50 µs or longer than 100 µs).

The second electrode structure 1340 is in contact with the second doping region 1320. The second electrode structure 1340 may be a metal structure deposited on the main surface or back side of the semiconductor substrate. The second electrode structure 1340 may comprise one or more layers. For example, the second electrode structure 1340 may comprise a silicide layer (e.g. cobalt silicide or titanium silicide) in contact with the semiconductor substrate followed by a metal layer (e.g. copper or aluminum).

The second electrode structure 1340 may be arranged at the main surface of the semiconductor substrate for implementing a lateral diode or lateral transistor or may be arranged at a back side of the semiconductor substrate for implementing a vertical diode or vertical transistor, for example. In other words, the second electrode structure 1340 may be in contact with the second doping region at a back side of the semiconductor substrate and the back side of the semiconductor substrate is located opposite to the main surface of the semiconductor substrate.

For example, the first doping region 1310 may extend into a depth of less than 4 µm (e.g. between 1 µm and 3 µm) into the semiconductor substrate.

The second doping region 1320 may comprise portions with different doping concentrations. For example, the second doping region 1320 may comprise a drift region and an emitter region (e.g. cathode region of a diode). The emitter region may be in contact with the second electrode structure 1340 at a back side of the semiconductor substrate. Further, the emitter region may comprise a higher average doping concentration (e.g. between $1*10^{16}$ cm$^{-3}$ and $1*10^{20}$ cm$^{-3}$) than the drift region.

Figure 14:
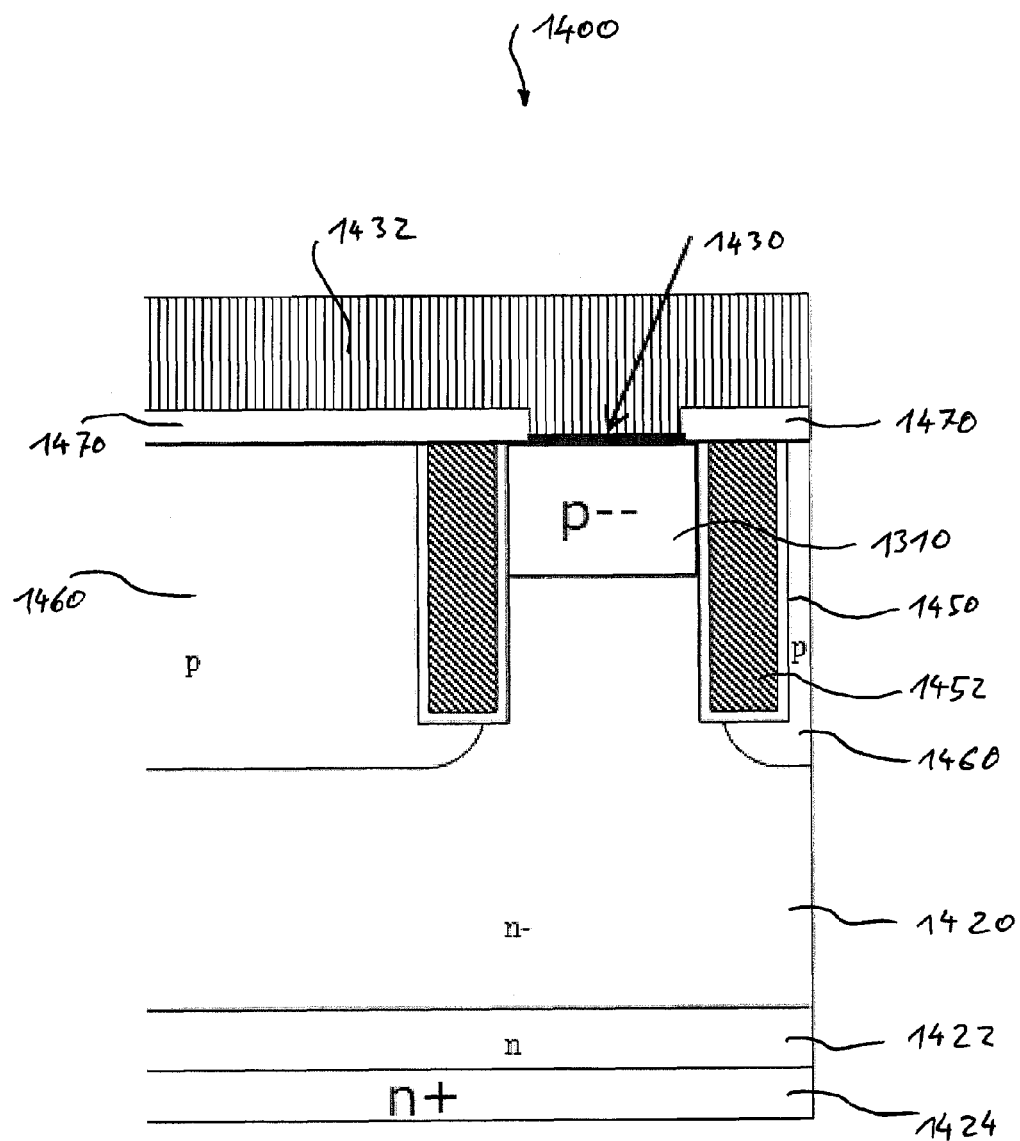
FIG. 14 shows a schematic illustration of a semiconductor device with trenches.

Further, the second doping region 1320 may comprise an optional field stop region located between the drift region and the emitter region (e.g. FIG. 14). The field stop region may comprise an average doping concentration between a doping concentration of the drift region and a doping concentration of the emitter region.

The drift region may comprise a thickness depending on the voltage class of the semiconductor device. (e.g. approximately the blocking voltage of the device divided by a number between 8 and 12, e.g. 10).

The optional field stop region may comprise a thickness between 3 µm and 10 µm, for example. The emitter region may comprise a thickness below 1 µm, for example.

The semiconductor device 1300 may optionally comprise an insulation trench (e.g. FIG. 14) surrounding at least a part of the first doping region 1310 (or may surround the first doping region laterally completely). The trenches may reduce the risk that the field reaches the first electrode structure 1330 causing a break through.

More details and aspects of the semiconductor device 1300 (e.g. transistor structure, doping concentrations, additional structures) are mentioned in connection with the proposed concept or one or more examples described above (e.g. FIG. 1a to 12). The semiconductor device 1300 may comprise one or more additional optional features corresponding to one or more aspects of the proposed concept or one or more examples described above or below.

Some embodiments relate to a semiconductor device comprising a first doping region extending from a main surface of a semiconductor substrate into the semiconductor substrate. The first doping region comprises a first conductivity type. Further, the semiconductor device comprises a second doping region arranged adjacent to the first doping region. The second doping region comprises a second conductivity type. The first doping region comprises at least one low doping dose portion extending from the main surface of the semiconductor substrate to the second doping region. A doping dose within the low doping dose portion of the first doping region is less than 3 times a breakdown charge. Additionally, the semiconductor device comprises a first electrode structure in contact with the first doping region at the main surface of the semiconductor substrate and an insulation trench adjacent to at least a part of the first doping region. Further, the semiconductor device comprises a second electrode structure in contact with the second doping region.

The insulation trench may improve the breakdown behavior or may increase the breakdown voltage, although the first doping region is very lightly doped, for example.

For example, an even lower doping dose may be possible due to the insulation trench. For example, the doping dose within the low doping dose portion of the first doping region is less than 1 time (or less than 2 times) a breakdown charge.

More details and aspects of the semiconductor device with the insulation trench (e.g. first doping region, second doping region, first electrode structure, second electrode structure) are mentioned in connection with the proposed concept or one or more examples described above or below (e.g. FIG. 13). The semiconductor device 1400 may comprise one or more additional optional features corresponding to one or more aspects of the proposed concept or one or more examples described above or below.

FIG. 14 may show an example of a semiconductor device 1400 implementing a diode with an insulation trench 1450 surrounding the first doping region 1310. The first doping region 1310 comprises a very low p-doping p⁻⁻.

The insulation trench 1450 laterally surrounds the first doping region 1310, while the first doping region 1310 is in contact with the first electrode structure at the main surface of the semiconductor substrate of the semiconductor device 1400 and borders on the second doping region at an opposite side. The insulation trench 1450 extends deeper into the semiconductor substrate than the first doping region 1310. The insulation trench 1450 may be completely filled with insulating material (e.g. oxide) or may contain a trench electrode 1452 (e.g. poly silicon or copper) insulated from the semiconductor substrate by an insulating layer (e.g. oxide). The optional trench electrode 1452 may be a floating electrode or short cut with the first electrode structure, for example.

For example, the insulation trench 1450 may extend more than 1 μm (or more than 2 μm or more than 5 μm) deeper into the semiconductor substrate than the first doping region 1310.

The second doping region comprises a lightly n-doped n⁻ drift region 1420, an n-doped n field stop region 1422 and a highly n-doped n⁺ emitter or cathode region.

A (e.g. maximal or average) lateral extension (e.g. along the main surface) of the first doping region 1310 (or distance of opposing parts of the insulation trench) may be between 3% and 10% (e.g. 5%) of a width of a depletion region in a blocking state of the semiconductor device 200, for example.

The first electrode structure may comprise a contact metal layer 1430 (e.g. platinum silicide or iridium silicide) located at least at the contact area with the first doping region 1310. Further, the first electrode structure may comprise a second metal layer 1432 (e.g. copper or aluminum) deposited on the contact metal layer 1430. The second metal layer 1432 may comprise a significantly larger thickness (e.g. more than 5 times larger, more than 10 times larger or more than 50 times larger) than the contact metal layer 1430.

At least a part of the first electrode structure may be insulated from the semiconductor substrate outside the first doping region 1310 by an insulation layer 1470.

Optionally, the semiconductor device 1400 may comprise a floating doping region 1460 comprising the first conductivity type. The floating doping region 1460 may be located adjacent to the insulation trench opposite to the first doping region 1310. The floating doping region 1460 may extend deeper into the semiconductor substrate than the first doping region 1310. The floating doping region 1460 may also extend deeper into the semiconductor substrate than the insulation trench 1450. The floating doping region 1460 may comprise a higher average doping concentration than the first doping region 1310. The one or more floating doping regions 1460 may be separated from the first doping region 1310 by the insulation trench and the second doping region.

A plurality of equal or similar structures (trench cells) as shown in FIG. 14 (e.g. first doping region, insulation trenches) may be distributed over the semiconductor substrate.

More details and aspects of the semiconductor device 1400 (e.g. first doping region, second doping region, first electrode structure, second electrode structure) are mentioned in connection with the proposed concept or one or more examples described above (e.g. FIG. 13). The semiconductor device 1400 may comprise one or more additional optional features corresponding to one or more aspects of the proposed concept or one or more examples described above or below.

FIG. 14 may show an example of a freewheeling diode with an ultra lightly doped anode. Trench structures and a special contact metal may be used for enabling the blocking capability. Optionally, not connected (floating) p-regions may be used between the trench cells for reducing the field strength at the trench bottom.

Figure 15:
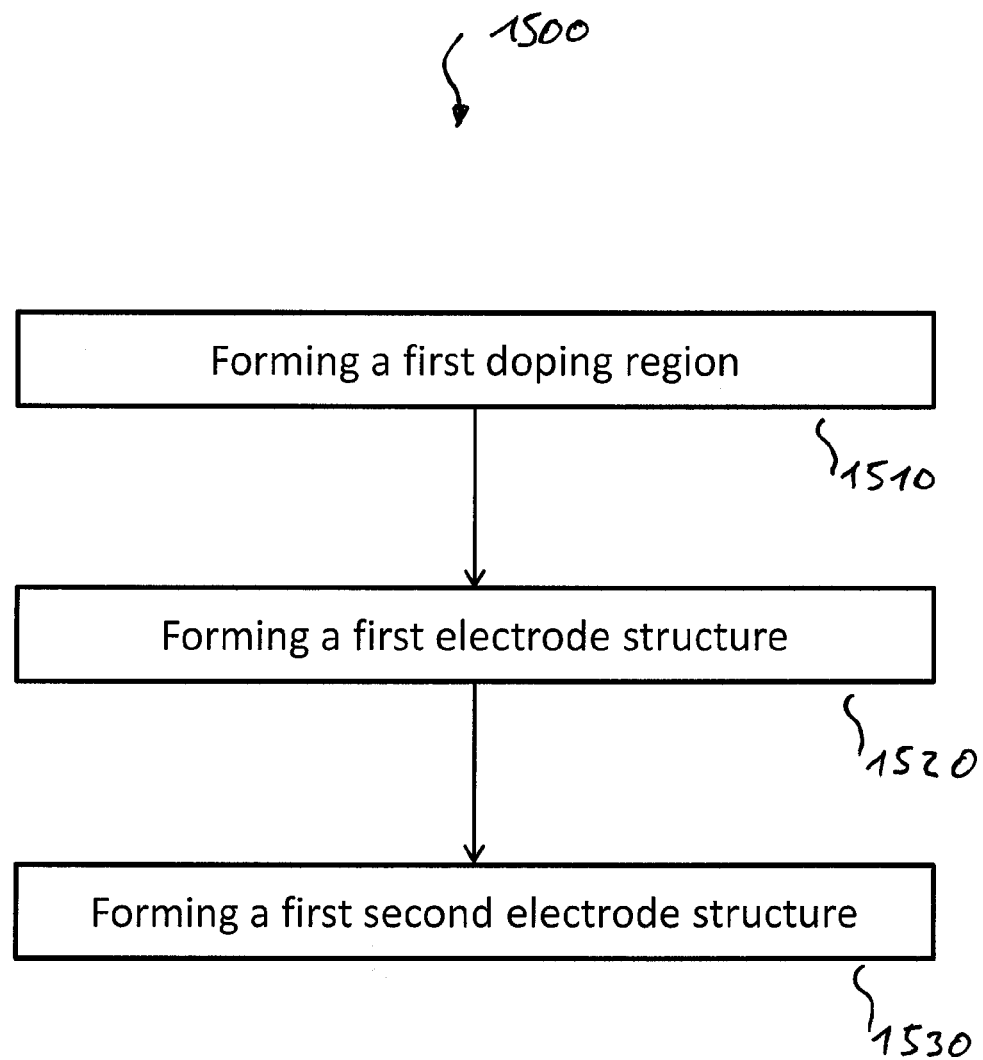
FIG. 15 shows a flow chart of a method for forming a semiconductor device.

FIG. 15 shows a flow chart of a method according to an embodiment. The method 1500 comprises forming 1510 a first doping region extending from a main surface of a semiconductor substrate into the semiconductor substrate. The first doping region comprises a first conductivity type. A second doping region is arranged adjacent to the first doping region. The second doping region comprises a second conductivity type. The first doping region comprises at least one low doping dose portion extending from the main surface of the semiconductor substrate to the second doping region. A doping dose within the low doping dose portion of the first doping region is less than 3 times a breakdown charge. Additionally, the method 1500 comprises forming 1520 a first electrode structure in contact with the first doping region at the main surface of the semiconductor substrate. The work function of the first electrode structure at the main surface of the semiconductor substrate is higher than the work function of the first doping region at the main surface of the semiconductor substrate. Further, the method 1500 comprises forming 1530 a second electrode structure in contact with the second doping region.

More details and aspects of the method 1500 are mentioned in connection with the proposed concept or one or more examples described above (e.g. FIG. 1a to 14). The method 1500 may comprise one or more additional optional acts corresponding to one or more aspects of the proposed concept or one or more examples described above or below.

Some embodiments relate to a high performance freewheeling diode with trench and ultra lightly doped anode structure.

The front side plasma charge carrier density may be kept low in order to keep the switching losses during commutating a freewheeling diode low.

For example, the anode may be weakly doped and additionally the charge carrier life time may be reduced by life time engineering. The lower limit of the doping may depend on several factors. A good ohmic contact with the front side metal may be desired resulting in at least a minimum doping. Further, the p-region may provide a minimum charge in the blocking case to prevent a field break through to the contact. Additionally, the anode design may influence the robustness and the cosmic radiation stability. However, a used life time doping method may increase the leakage current at high operation temperatures, which may hinder or may make the way to higher junction temperatures for high power densities difficult.

A proposed structure may enable a diode with extremely weak emitter efficiency without or reduced undesired influence regarding a reduced blocking capability. Additionally, a proposed structure may enable the implementation of a high performance freewheeling diode without the application of methods for charge carrier life time adjustment. A life time adjustment may be implemented by a heavy metal diffusion (e.g. platinum or gold), an additional electron irradiation and/or proton irradiation, which may cause an increased leakage current at high operation temperatures, for example.

According to an aspect, the implementation of an ultra-lightly doped p-anode may be enabled by implementing trenches. The trenches may relieve the p-region and may hinder a punch-through of the electric field to the contact (e.g. FIG. 14). Additionally, a contact metal may be used that enables an ohmic contacting of a very lightly doped p− silicon. The contact material may comprise a work function WM larger than that of the semiconductor WS so that a band bending with positive curvature towards the metal-semiconductor transition may be obtained (e.g. FIG. 16). The valence band in the semiconductor may bend towards the Fermi level so that the holes of the semiconductor may flow unhindered without potential barrier to the metal contact. In this way, a very good ohmic contact to the lightly doped p-region may be implemented and the charge density of holes close to the metal-semiconductor transition may be increased. The Fermi level may move closer to the valence band.

Some silicides (metal-silicon-composition) with components of platinum and/or iridium may be used as contact material with corresponding work function (e.g. FIG. 17). Platinum silicide (PtSi) may be used for a high-voltage freewheeling diode or a diode region in a reverse conducting IGBT, for example.

The proposed concept may enable the optimization or improvement of the plasma profile in comparison to other freewheeling diodes (e.g. FIG. 19), may enable the saving of the relatively complex process for life time doping and/or may enable an increase of a maximal junction temperature due to the reduction of hot leakage currents.

For example, the optimization or improvement of the plasma profile and/or the increase of a maximal junction temperature may be important for implementing higher power densities in IGBT-modules with freewheeling diodes.

Figure 18:
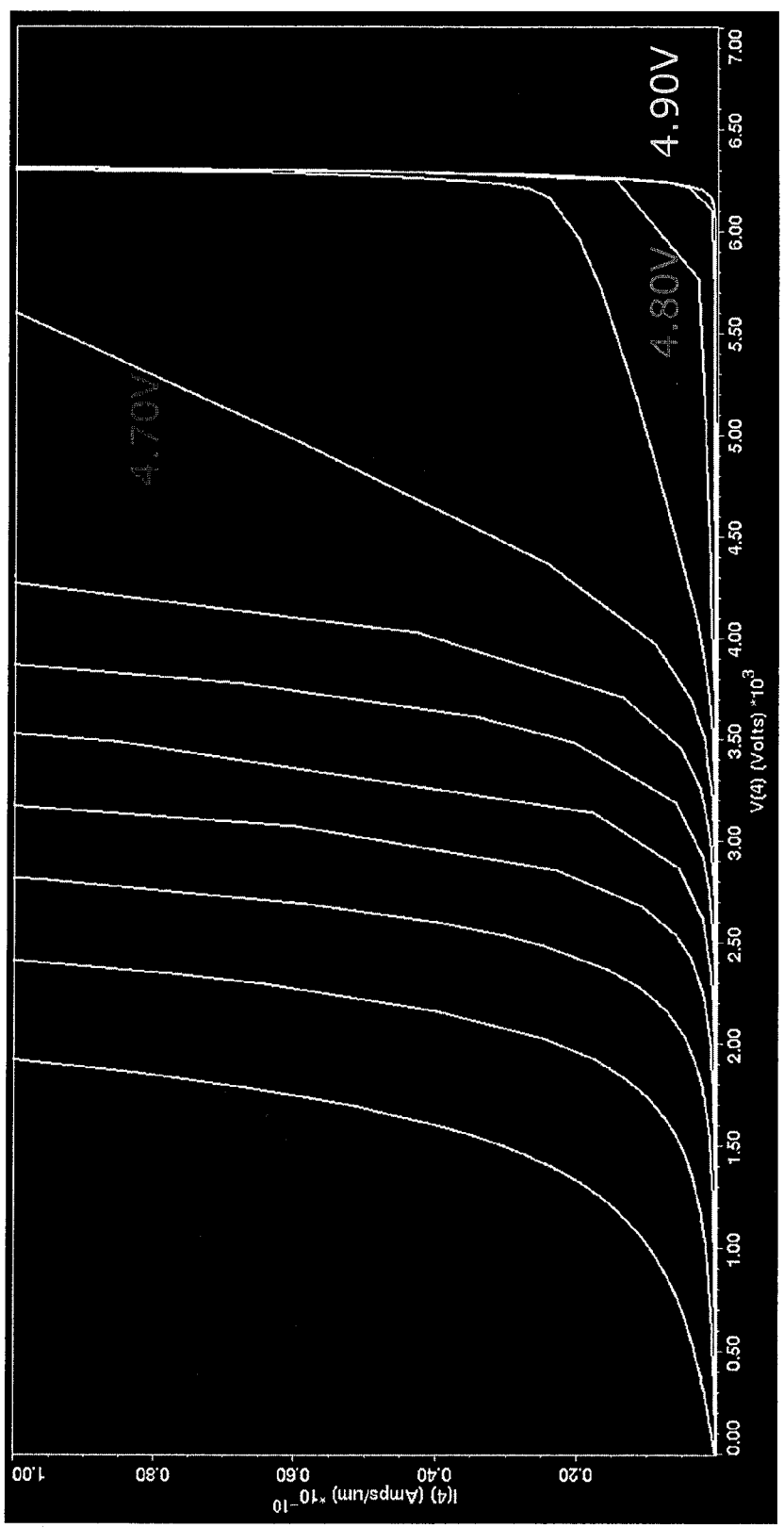
FIG. 18 shows a leakage current of a semiconductor device.

According to an aspect, a freewheeling diode with an ultra-lightly doped p-anode without carrier life time doping may be implemented. For this, trench cells or trench structures may be integrated in the diode structure and a contact material with a specific work function WM may be used. The contact material may comprise a very high work function, which is larger than that of the lightly p-doped silicon. FIG. 16 shows a schematic band structure of the metal-semiconductor transition. By a suitable selection of a metal with a mentioned high work function, a band bending in the semiconductor may be obtained, which may lead to an increased hole concentration at the metal-semiconductor interface. Further, the holes of the only lightly p-doped Si-region may see no energy bather at the metal-semiconductor transition resulting in a good ohmic contact. The band deformation of the valence band at the metal-semiconductor transition may function comparable to a higher p-doped semiconductor and may suppress a punch-through of the field to the metal contact. FIG. 18 shows the simulated blocking current (leakage current) behavior of a proposed structure in dependency on the work function of the metal (varying from 4.35 eV to 4.90 eV in 0.05 eV steps). The leakage current of an extreme lightly doped anode (e.g. <3× the break down charge) may stay at a very low level also up to the break through voltage, if a high work function (for the contact metal) of more than 4.9 eV is used, for example.

Figure 19:
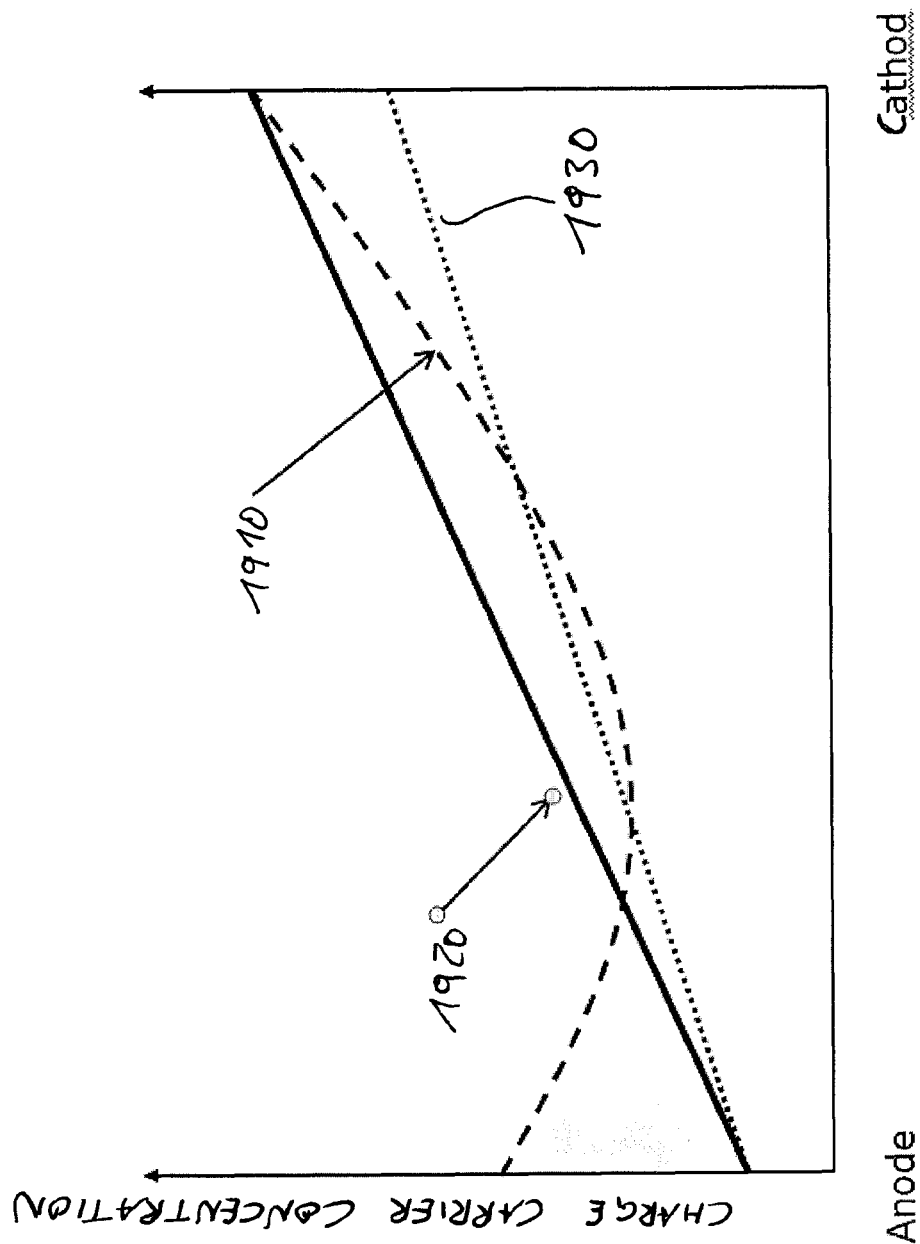
FIG. 19 shows a charge carrier profile of a freewheeling diode.

A proposed structure may enable the implementation of an optimal or improved plasma profile for a freewheeling diode, which may be strongly decreasing towards the front side or main surface (e.g. FIG. 19).

Optionally, the back side n-emitter may be decreased in its efficiency for a further optimization or improvement of the switching properties in order to obtain comparable or even lower storage charge as at other structures (e.g. dotted line in FIG. 19).

FIG. 19 shows a possible charge carrier profile of a freewheeling diode in a flooded state (conducting state) for a proposed structure (e.g. FIG. 13 or 14) with a high emitter doping 1920 (e.g. doping dose between $1*10^{15}$ to $1*10^{16}$ resulting in an average or edge doping concentration in the emitter region between $1*10^{18}$ to $1*10^{20}$) and a lower emitter doping 1930 (e.g. doping dose between $1*10^{13}$ to $1*10^{15}$ resulting in an average or edge doping concentration in the emitter region between $1*10^{16}$ to $1*10^{19}$). In comparison, another structure with targeted charge carrier life time reduction 1910 is shown. A proposed structure (e.g. FIG. 13 or 14) may comprise a basically linear charge carrier profile (e.g. deviation of less than 10% from a linear behavior) in the conducting state or flooded state.

The proposed structure may be investigated by SEM (scanning electron microscopy) of cross sections or SIMS (secondary ion mass spectroscopy) measurement for material analysis and for determining the contact materials, for example.

Example embodiments may further provide a computer program having a program code for performing one of the above methods, when the computer program is executed on a computer or processor. A person of skill in the art would readily recognize that steps of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . ." (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device, comprising:
   a first doping region extending from a main surface of a semiconductor substrate into the semiconductor substrate, wherein the first doping region comprises a first conductivity type;
   a second doping region arranged adjacent to the first doping region, wherein the second doping region comprises a second conductivity type, wherein the first doping region comprises at least one low doping dose portion extending from the main surface of the semiconductor substrate to the second doping region, wherein a doping dose within the low doping dose portion of the first doping region is less than 3 times a breakdown charge;
   a first electrode structure in contact with the first doping region at the main surface of the semiconductor substrate, wherein the work function of the first electrode structure at the main surface of the semiconductor substrate is larger than 4.9 eV or lower than 4.4 eV; and
   a second electrode structure in contact with the second doping region.

2. The semiconductor device according to claim 1, wherein a Schottky barrier between the first electrode structure and the first doping region is lower than 0.3 eV for majority charge carriers of the first doping region.

3. The semiconductor device according to claim 1, wherein the first electrode structure comprises platinum silicide or iridium silicide.

4. The semiconductor device according to claim 1, wherein a charge carrier life time within at least a part of the second doping region is longer than 10 µs.

5. The semiconductor device according to claim 1, wherein a doping dose within the low doping dose portion of the first doping region is less than 1 time a breakdown charge.

6. The semiconductor device according to claim 1, wherein the first doping region and the second doping region implement a bipolar diode between the first electrode structure and the second electrode structure.

7. The semiconductor device according to claim 1, wherein the second electrode structure is in contact with the second doping region at a back side of the semiconductor substrate, wherein the back side of the semiconductor substrate is located opposite to the main surface of the semiconductor substrate.

8. The semiconductor device according to claim 1, wherein the second doping region comprises a drift region and an emitter region, wherein the emitter region is in contact with the second electrode structure at a back side of the semiconductor substrate, wherein the emitter region comprises a higher average doping concentration than the drift region.

9. The semiconductor device according to claim 1, wherein the first doping region extends into a depth of less than 4 µm into the semiconductor substrate.

10. The semiconductor device according to claim 1, comprising an insulation trench adjacent to at least a part of the first doping region.

11. The semiconductor device according to claim 10, wherein the insulation trench comprises a trench electrode insulated from the semiconductor substrate by an insulating layer within the insulation trench, wherein the trench electrode is short cut with the first electrode structure.

12. The semiconductor device according to claim 10, wherein the insulation trench extends deeper into the semiconductor substrate than the first doping region.

13. The semiconductor device according to claim 10, comprising a floating doping region comprising the first conductivity type, wherein the floating doping region is located adjacent to the insulation trench opposite to the first doping region.

14. The semiconductor device according to claim 1, wherein the first doping region is an anode/cathode region of a diode and the second doping region is the cathode/anode region of the diode.

15. A semiconductor device, comprising:
   a first doping region extending from a main surface of a semiconductor substrate into the semiconductor substrate, wherein the first doping region comprises a first conductivity type;
   a second doping region arranged adjacent to the first doping region, wherein the second doping region comprises a second conductivity type, wherein the first doping region comprises at least one low doping dose portion extending from the main surface of the semiconductor substrate to the second doping region, wherein a doping dose within the low doping dose portion of the first doping region is less than 3 times a breakdown charge;
   a first electrode structure in contact with the first doping region at the main surface of the semiconductor substrate;

an insulation trench adjacent to at least a part of the first doping region; and a second electrode structure in contact with the second doping region.

16. The semiconductor device according to claim 15, wherein the first doping region is an anode/cathode region of a diode and the second doping region is the cathode/anode region of the diode.

* * * * *